(12) United States Patent
Lee et al.

(10) Patent No.: US 12,514,094 B2
(45) Date of Patent: Dec. 30, 2025

(54) ELECTRONIC DEVICE INCLUDING UNDER DISPLAY CAMERA AND DISPLAY INCLUDED IN THE SAME

(71) Applicant: SAMSUNG ELECTRONICS CO., LTD., Suwon-si (KR)

(72) Inventors: Dongseop Lee, Suwon-si (KR); Sungyoung Shin, Suwon-si (KR); Kwangtai Kim, Suwon-si (KR); Minsuk Uhm, Suwon-si (KR); Donghyun Yeom, Suwon-si (KR); Yilin Wu, Suwon-si (KR); Haechang Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 564 days.

(21) Appl. No.: 17/939,534

(22) Filed: Sep. 7, 2022

(65) Prior Publication Data

US 2023/0050153 A1 Feb. 16, 2023

Related U.S. Application Data

(63) Continuation of application No. PCT/KR2022/012097, filed on Aug. 12, 2022.

(30) Foreign Application Priority Data

Aug. 12, 2021 (KR) .................. 10-2021-0106823
Oct. 28, 2021 (KR) .................. 10-2021-0145216

(51) Int. Cl.
*H10K 59/88* (2023.01)
*H10K 59/65* (2023.01)

(52) U.S. Cl.
CPC ............. *H10K 59/65* (2023.02); *H10K 59/88* (2023.02)

(58) Field of Classification Search
CPC .............................. H10K 59/88; H10K 59/65
(Continued)

(56) References Cited

U.S. PATENT DOCUMENTS 10,056,023 B2   8/2018   Kang et al.
10,658,442 B2   5/2020   Kim et al.
(Continued)

FOREIGN PATENT DOCUMENTS

CN   108389879   8/2018
CN   110783384   2/2020
(Continued)

OTHER PUBLICATIONS

Extended European Search Report dated Oct. 4, 2024 issued in European Patent Application No. 22856277.3.
(Continued)

*Primary Examiner* — Christopher M Raabe
(74) *Attorney, Agent, or Firm* — Nixon & Vanderhye, P.C.

(57) ABSTRACT

An electronic device according to various embodiments disclosed herein may include: a display panel including a light-emitting layer in which multiple light-emitting parts are arranged and a circuit layer in which multiple circuit parts electrically connected to at least some of the multiple light-emitting parts are arranged, the display panel including a first area, a second area adjacent to the first area, and a third area other than the first area and the second area, and a camera disposed on or under a rear surface of a display including the display panel such that a lens of the camera faces the first area of the display panel, wherein the first area of the display panel may be an area in which the circuit parts are not present, and an area in which a first light-emitting part connected to a circuit part positioned in the second area is disposed, the second area of the display panel may be an (Continued)

area in which second light-emitting parts connected to the circuit part positioned in the second area and a dummy light-emitting part not connected to the circuit part are arranged, and the third area of the display panel may be an area in which a fourth light-emitting part connected to a circuit part disposed in the third area is disposed.

20 Claims, 14 Drawing Sheets

(58) Field of Classification Search
USPC .......................................................... 313/110
See application file for complete search history.

(56) References Cited

U.S. PATENT DOCUMENTS

| | | | |
|---|---|---|---|
| 10,802,350 | B2 | 10/2020 | Shioaku et al. |
| 11,005,073 | B2 | 5/2021 | Wang |
| 2018/0190190 | A1 | 7/2018 | Xi et al. |
| 2020/0176526 | A1 | 6/2020 | Yoon et al. |
| 2021/0050389 | A1* | 2/2021 | Yang .................... H10K 59/121 |
| 2021/0066642 | A1 | 3/2021 | Lee et al. |
| 2021/0193756 | A1 | 6/2021 | Oh et al. |
| 2021/0193951 | A1 | 6/2021 | Wu |
| 2021/0202587 | A1 | 7/2021 | Kim et al. |
| 2021/0202588 | A1 | 7/2021 | Cho et al. |
| 2021/0225260 | A1 | 7/2021 | Liao |
| 2021/0359080 | A1* | 11/2021 | Xu ..................... H10K 59/1315 |
| 2022/0069023 | A1 | 3/2022 | Lou et al. |
| 2022/0157895 | A1* | 5/2022 | Xu ....................... H10K 59/131 |
| 2022/0231093 | A1* | 7/2022 | Zhang .................... H10K 59/88 |
| 2022/0320474 | A1* | 10/2022 | Shin ..................... H10K 59/122 |
| 2023/0157143 | A1 | 5/2023 | Huang et al. |

FOREIGN PATENT DOCUMENTS

| | | |
|---|---|---|
| KR | 10-2019-0081953 | 7/2019 |
| KR | 10-2021-0041087 | 4/2021 |
| KR | 10-2021-0078129 | 6/2021 |
| KR | 10-2021-0085902 | 7/2021 |
| KR | 10-2021-0086791 | 7/2021 |
| WO | 2021/068571 | 4/2021 |

OTHER PUBLICATIONS

Search Report and Written Opinion dated Nov. 22, 2022 issued in International Patent Application No. PCT/KR2022/012097.
1 Office Action dated Aug. 22, 2025 in Korean Patent Application No. 10-2021-0145216 and English-language translation.

* cited by examiner

ELECTRONIC DEVICE INCLUDING UNDER DISPLAY CAMERA AND DISPLAY INCLUDED IN THE SAME

CROSS-REFERENCE TO RELATED APPLICATIONS

This application is a continuation of International Application No. PCT/KR2022/012097 designating the United States, filed on Aug. 12, 2022, in the Korean Intellectual Property Receiving Office and claiming priority to Korean Patent Application No. 10-2021-0106823, filed on Aug. 12, 2021, in the Korean Intellectual Property Office and to Korean Patent Application No. 10-2021-0145216, filed on Oct. 28, 2021, in the Korean Intellectual Property Office, the disclosures of all of which are incorporated by reference herein in their entireties.

BACKGROUND

Field

The disclosure relates to an electronic device including an under-display camera disposed under a display, and a display included in the electronic device.

Description of Related Art

An electronic device may have various kinds of cameras disposed in various positions. Some of the cameras included in the electronic device may be disposed such that images can be captured in the forward direction of the electronic device.

The electronic device may have a display disposed on the front surface so as to display information. A camera for forward image capture may be disposed in a separate area so as to avoid the display area, or a partial area of the display may be incised such that the same is disposed therein.

If the camera for forward image capture is disposed to avoid the display area, there is a drawback in that the display area is reduced. If the camera is disposed in a partially incised area of the display area, there is a drawback in that information cannot be displayed in the area that faces the camera when the display is activated, and the aesthetic completeness is degraded.

In an attempt to address this, there has been development of under-display camera technology such that, while a camera is disposed on the back surface of a display, information can be displayed in the area that faces the camera.

The arrangement relationship of various components (for example, light-emitting elements, circuit elements) of a display may be adjusted such that, while a camera is disposed on the display back surface, information can be displayed in the corresponding area. This poses a problem in that respective areas of the display may give different visual impressions when the display is deactivated.

SUMMARY

Embodiments of the disclosure may provide a display configured such that areas of the display give similar visual impressions when the display is deactivated, while providing a structure for implementing an under-display camera, and an electronic device including the same.

An electronic device according to various example embodiments disclosed herein may include: a display panel including a light-emitting layer in which multiple light-emitting parts are arranged and a circuit layer in which multiple circuit parts electrically connected to at least some of the multiple light-emitting parts are arranged, the display panel including a first area, a second area adjacent to the first area, and a third area other than the first area and the second area, and a camera disposed on or under the rear surface of a display including the display panel wherein a lens part of the camera faces the first area of the display panel, wherein the first area of the display panel is an area from which the circuit parts are removed, and an area in which a first light-emitting part connected to a circuit part positioned in the second area is disposed, the second area of the display panel is an area in which second light-emitting parts connected to the circuit part positioned in the second area and a dummy light-emitting part not connected to the circuit part are arranged, and the third area of the display panel is an area in which a fourth light-emitting part connected to a circuit part disposed in the third area is disposed.

An electronic device according to various example embodiments disclosed herein may include: a display panel including a transmission layer including multiple transmission parts configured to transmit light, a light-emitting layer in which multiple light-emitting parts are arranged, and a circuit layer in which multiple circuit parts electrically connected to at least some of the multiple light-emitting parts are arranged, the display panel including a first area, a second area adjacent to the first area, and a third area other than the first area and the second area, and a camera disposed on or under the rear surface of the display panel such that a lens part of the camera faces the first area of the display panel, wherein the first area of the display panel is an area from which the circuit parts are removed, and an area including a first light-emitting part connected to a circuit part positioned in the second area and a first transmission part disposed at a position facing the first light-emitting part, the second area of the display panel is an area including second light-emitting parts connected to the circuit part positioned in the second area, second transmission parts arranged at position facing the second light-emitting parts, and a third transmission part disposed between the second transmission parts to be disposed at a position facing a space between the second light-emitting parts, and the third area of the display panel is an area including a fourth light-emitting part connected to a circuit part disposed in the third area and a fourth transmission part disposed at a position facing the fourth light-emitting part.

A display according to various example embodiments disclosed herein may include: a display panel including a light-emitting layer in which multiple light-emitting parts are arranged and a circuit layer in which multiple circuit parts electrically connected to at least some of the multiple light-emitting parts are arranged, the display panel including a first area, a second area adjacent to the first area, and a third area other than the first area and the second area, wherein the first area of the display panel is an area facing a lens part of a camera device disposed on or under the rear surface of the display and from which the circuit parts are removed, and an area in which a first light-emitting part connected to a circuit part positioned in the second area is disposed, the second area of the display panel is an area in which second light-emitting parts connected to the circuit part positioned in the second area and a dummy light-emitting part not connected to the circuit part are arranged, and the third area of the display panel is an area in which a fourth light-emitting part connected to a circuit part disposed in the third area is disposed.

A display according to various example embodiments disclosed herein may include: a display panel including a transmission layer including multiple transmission parts configured to transmit light, a light-emitting layer in which multiple light-emitting parts are arranged, and a circuit layer in which multiple circuit parts electrically connected to at least some of the multiple light-emitting parts are arranged, the display panel including a first area, a second area adjacent to the first area, and a third area other than the first area and the second area, wherein the first area of the display panel is an area facing a lens part of a camera device disposed on or under the rear surface of the display and from which the circuit parts are removed, and an area including a first light-emitting part connected to a circuit part positioned in the second area and a first transmission part disposed at a position facing the first light-emitting part, the second area of the display panel is an area including second light-emitting parts connected to the circuit part positioned in the second area, second transmission parts disposed at a position facing the second light-emitting parts, and a third transmission part disposed between the second transmission parts disposed at a position facing a space between the second light-emitting parts, and the third area of the display panel is an area including a fourth light-emitting part connected to a circuit part disposed in the third area and a fourth transmission part disposed at a position facing the fourth light-emitting part.

According to various example embodiments disclosed herein, visual information may be delivered through an area that faces a camera when a display is activated. In addition, there may be a reduced difference in visual impression between an area in which the camera is disposed and an adjacent area when the display is deactivated.

BRIEF DESCRIPTION OF THE DRAWINGS

In connection with the description of the drawings, same or similar reference numerals will be used to refer to same or similar elements. Further, the above and other aspects, features and advantages of certain embodiments of the present disclosure will be more apparent from the following detailed description, taken in conjunction with the accompanying drawings, in which.

DETAILED DESCRIPTION

Figure 1:
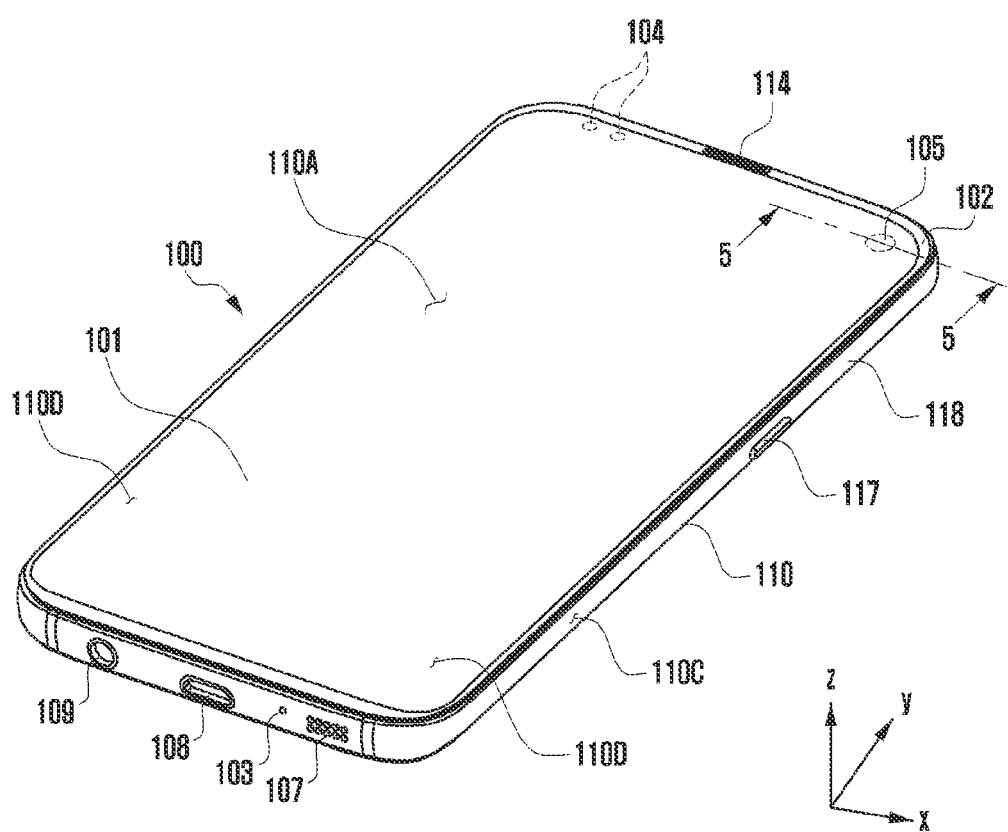
FIG. 1 is a front perspective view of a mobile electronic device according to various embodiments.

It should be appreciated that various embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

Figure 2:
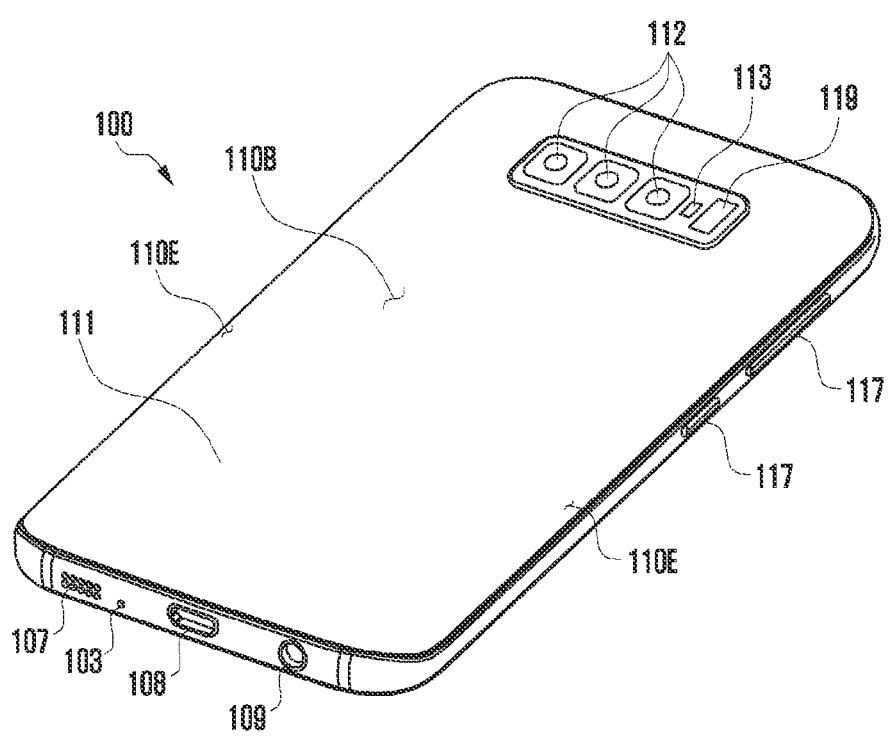
FIG. 2 is a rear perspective view of the electronic device of FIG. 1 according to various embodiments.

FIG. 1 is a perspective view illustrating a front surface of a mobile electronic device 100 according to various embodiments, and FIG. 2 is a perspective view illustrating a rear surface of the mobile electronic device 100 shown in FIG. 1 according to various embodiments.

Referring to FIGS. 1 and 2, the mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, an input device 103, audio output devices 107 and 114, sensor modules 104 and 119, camera devices 105, 112 and 113, a key input device 117, an indicator, and a connector 108. The mobile electronic device 100 may omit at least one (e.g., the key input device 117 or the indicator) of the above components, or may further include other components.

The display 101 may be visible through a substantial portion of the front plate 102, for example. At least a part of the display 101 may be visible through the front plate 102 that forms the first surface 110A and the first region 110D of the lateral surface 110C. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The input device 103 may include a microphone 103. In a case, the input device may contain a plurality of microphones to sense a sound direction. The audio output devices 107 and 114 may include speakers 197 and 114. The speakers 107 and 114 may include an external speaker 107 and a call receiver 114. In various embodiments, the microphone 103, speakers 107 and 114, and the connector 108 disposed in an internal space of the electronic device 100 or exposed to an external environment through at least one hole. In various embodiments, the microphone 103 and speakers 107 and 114 may use same hole formed on housing 110. In a case, the audio output devices 107 and 114 include a speaker which does not need the hole (e.g., piezo speaker).

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera devices 105, 112 and 113 may include a first camera device 105 disposed on the first surface 110A of the electronic device 100, and a second camera device 112 and/or a flash 113 disposed on the second surface 110B. The camera device 105 or the camera device 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101.

The indicator may be disposed on the first surface 110A of the housing 110. For example, the indicator may provide status information of the electronic device 100 in an optical form. The indicator may provide a light source associated with the operation of the camera module 105. The indicator may include, for example, a light emitting diode (LED), an IR LED, or a xenon lamp.

The connector holes 108 and 109 may include a first connector hole 108 adapted for a connector (e.g., a USB connector) for transmitting and receiving power and/or data to and from an external electronic device, and/or a second connector hole 109 adapted for a connector (e.g., an earphone jack) for transmitting and receiving an audio signal to and from an external electronic device.

Some camera devices 105 of camera devices 105 and 112, some sensor modules 104 of sensor modules 104 and 119, or an indicator may be arranged to be exposed through a display 101. For example, the camera device 105, the sensor module 104, or the indicator may be arranged in the internal space of an electronic device 100 so as to be brought into contact with an external environment through an opening of the display 101, which is perforated up to a front plate 102. In an embodiment, some sensor modules 104 may be arranged to perform their functions without being visually exposed through the front plate 102 in the internal space of the electronic device. For example, in this case, an area of the display 101 facing the sensor module may not require a perforated opening.

According to various embodiments, although the electronic device 100 has a bar type or a plate type appearance, the present application does not limit the electronic device appearance. For example, the electronic device 100 may be part of a foldable electronic device, slidable electronic device, stretchable electronic device, or rollable electronic device. "The foldable electronic device", "The slidable electronic device", "The stretchable electronic device", or "The rollable electronic device" may include the flexible display can be deformed. The Flexible display can be deformed by relative movement (e.g., a folding, a sliding, a stretching, a rolling) of instrument which supports the flexible display. In an embodiment, some parts of the flexible display may insert to the inside of the electronic device 100 or some parts of the flexible display may pull out to external of the electronic device 100 such that the display area shown to external may increase or decrease.

Figure 3:
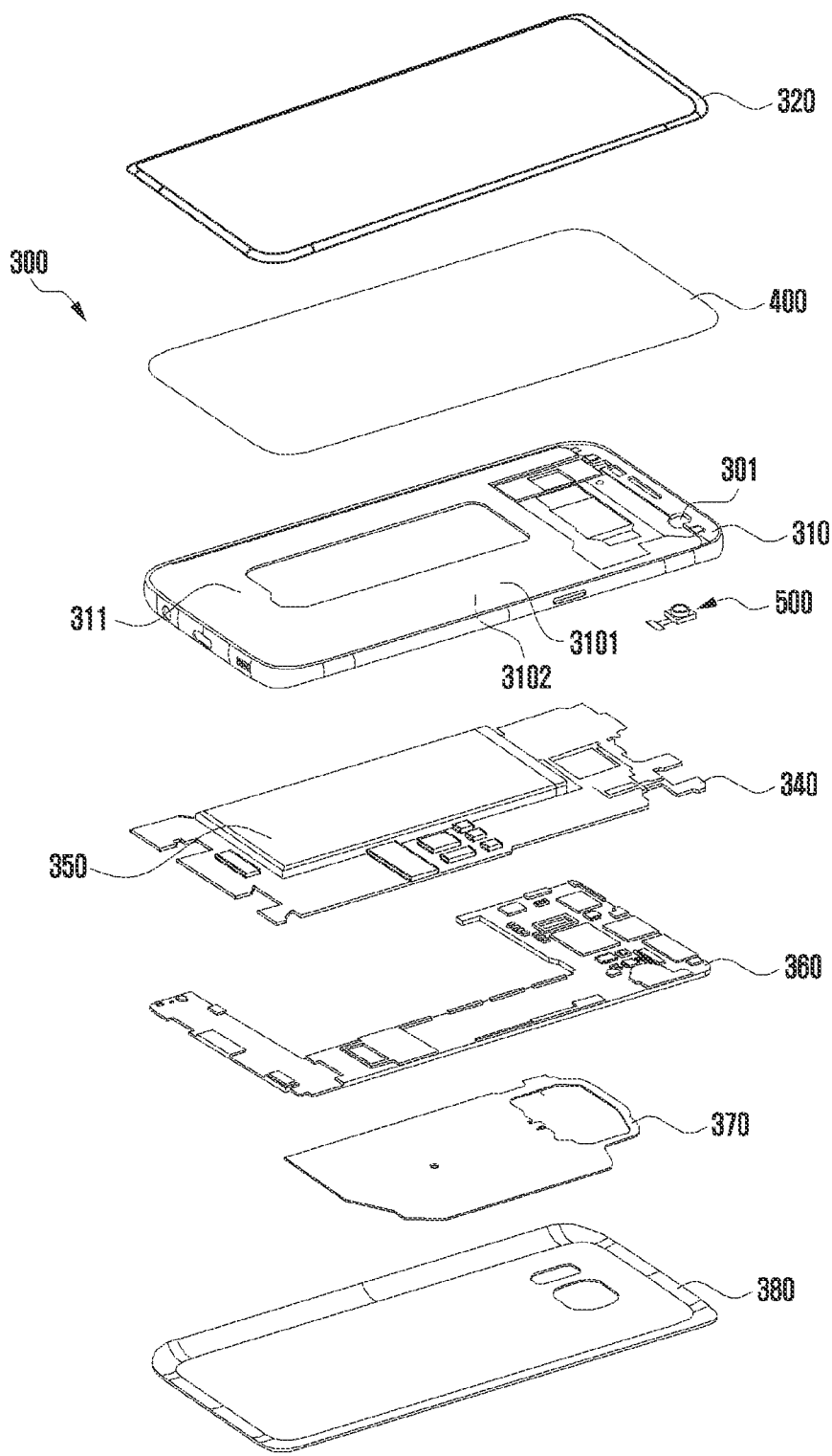
FIG. 3 is an exploded perspective view of the electronic device of FIG. 1 according to various embodiments.

FIG. 3 is an exploded perspective view illustrating a mobile electronic device 200 shown in FIG. 1 according to various embodiments.

The electronic device 300 of FIG. 3 may be similar to the electronic device 200 of FIG. 1 and FIG. 2 or may include other embodiments of an electronic device.

Referring to FIG. 3, the mobile electronic device 300 may include a lateral bezel structure 310, a first support member 311 (e.g., a bracket), a front plate 320, a display 330, a PCB 340 (e.g., a printed circuit board, flexible FPCB, or RFPCB), a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 200 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the PCB 340 at the other side thereof. On the PCB 340, a processor, a memory, and/or an interface may be mounted. The processor may include, for example, one or more of a CPU, an AP, a GPU, an ISP, a sensor hub processor, or a Community Processer.

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

According to various embodiments, the first support member 311 of the lateral bezel structure 310 may include a first face 3101 facing the front plate 320 and a second face 3102 facing the opposite direction of the first face 3101 (e.g., a rear plate). In an embodiment, the camera device 500 disposed between the first support plate 311 and the rear plate 380. In an embodiment, the camera device 500 disposed to protrude or shown in direction of the front plate 320 through a penetrating hole 301 connected from the first face 3101 of the first support member 311 to the second face 3102 of the first support member 311. According to an embodiment, the protruding portion through the penetrating hole 301 of the camera device 500 disposed to corresponding location of display 400 to detect the external environment. In an embodiment, in case that the camera device 500 disposed between the display 400 and the first support member 311, the penetrating hole 301 can be removed.

Hereinafter, in the electronic device 300, the arrangement relationship of the display 400 and the camera device 500 will be described in greater detail with reference to the drawings.

Figure 4:
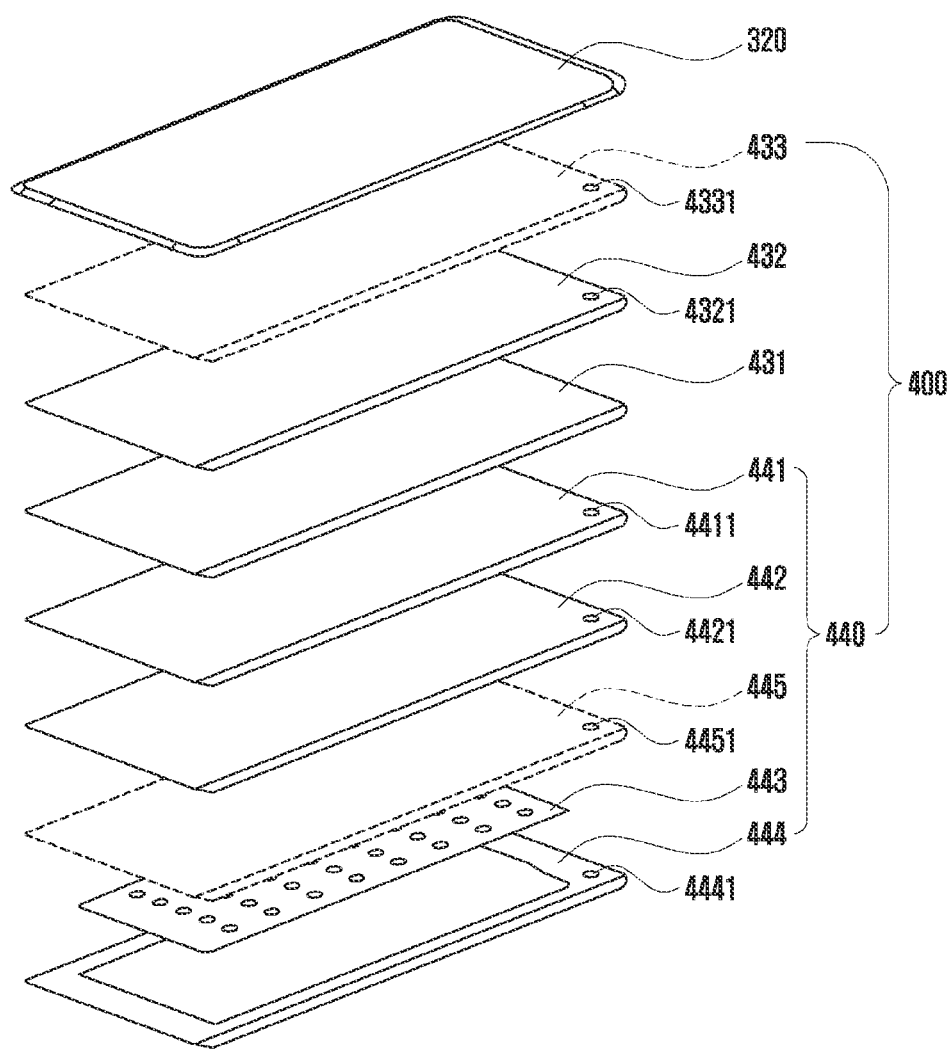
FIG. 4 is an exploded perspective view of a display according to various embodiments.

FIG. 4 is an exploded perspective view of a display 400 according to various embodiments.

A display 400 of FIG. 4 may be at least partially similar to the display 101 of FIG. 1, or may further include an embodiment of a display.

Referring to FIG. 4, the display 400 may include a polarizer (POL) 432 (e.g., a polarization film) disposed on the rear surface of the front cover 320 (e.g., a front plate, a glass plate, a first cover member, or a cover member) through an adhesive member, and at least one subsidiary material layer 440 attached onto the rear surface of a display panel 431. According to an embodiment, the adhesive member may include an optical clear adhesive (OCA), a pressure sensitive adhesive (PSA), a thermally responsive adhesive, a general adhesive, or a double-sided tape. According to an embodiment, the display panel 431 and the POL 432 may be integrally formed. In various embodiments, the POL 432 may be omitted. In various embodiments, the POL 432 may be replaced with color filters configured to transmit light of a specific wavelength. A blocking member (e.g., a black matrix (BM), or a pixel define layer (PDL)) made of a material having a high light absorption rate may be disposed between the color filters. The blocking member disposed between the color filters may prevent and/or reduce reflection of external light to improve viewing angle characteristics and to improve a visual sensation when the display is in an inactivated (off) state.

According to various embodiments, the display 400 may include a control circuit (not shown). According to an embodiment, the control circuit may include a flexible printed circuit board (FPCB) configured to electrically connect a main printed circuit board (e.g., the printed circuit board 340 of FIG. 3) and the display panel 431 of an electronic device (e.g., the electronic device 300 of FIG. 3), and a display driver IC (DDI) mounted on the FPCB. According to an embodiment, the display 400 may additionally include a touch panel 433 as well. According to an embodiment, in a case where the display 400 operates as the in-cell type or the on-cell type of a touch display according to the arrangement position of the touch panel 433, the control circuit may include a touch display driver IC (TDDI). As an embodiment, the display 400 may also include a fingerprint sensor (not shown) disposed around the control circuit. According to an embodiment, the fingerprint sensor may include an ultrasonic type or an optical type of a fingerprint sensor capable of recognizing a fingerprint of a finger which is in contact from the outer surface of the front cover 320 or adjacent thereto through a hole at least partially formed through some of elements of the display 400. As an embodiment, a detection member 445 may be disposed on the rear surface of a conductive member 444.

According to various embodiments, the at least one subsidiary material layer 440 may include at least one polymer member 441 or 442 disposed on the rear surface of the display panel 431, at least one functional member 443 disposed on the rear surface of the at least one polymer member 441 or 442, and the conductive member 444 disposed on the rear surface of the at least one functional member 443. According to an embodiment, the at least one polymer member 441 or 442 may include a light-blocking layer 441 (e.g., a black layer including uneven patterns) for removing air bubbles capable of being generated between the display panel 431 and attachment materials therebelow and blocking light generated in the display panel 431 or light incident from the outside, and/or a buffer layer 442 disposed for impact mitigation. According to an embodiment, the at least one functional member 443 may include a heat dissipation sheet (e.g., a graphite sheet) for heat dissipation, an added display, a force touch FPCB, a fingerprint sensor FPCB, an antenna radiator for communication, a conductive/non-conductive tape, or an open cell sponge. According to an embodiment, the conductive member 444 may be a metal sheet (a metal plate), and may be used in order to help rigidity reinforcement of an electronic device (e.g., the electronic device 300 of FIG. 3), shield ambient noise, and disperse heat radiated from heat-radiated components therearound. According to an embodiment, the conductive member 444 may include Cu, Al, Mg, SUS, or CLAD (e.g., a laminate member in which SUS and Al are alternately arranged). As an embodiment, the display 400 may further include the detection member 445 configured to detect an input by the electromagnetic induction type of a writing member (e.g., an electronic pen). According to an embodiment, the detection member 445 may include a digitizer. According to an embodiment, the detection member 445 may be disposed between the at least one buffer layer 442 and the functional member 443. As an embodiment, the detection member 445 may be disposed between the display panel 431 and the at least one polymer member 441.

Figure 5:
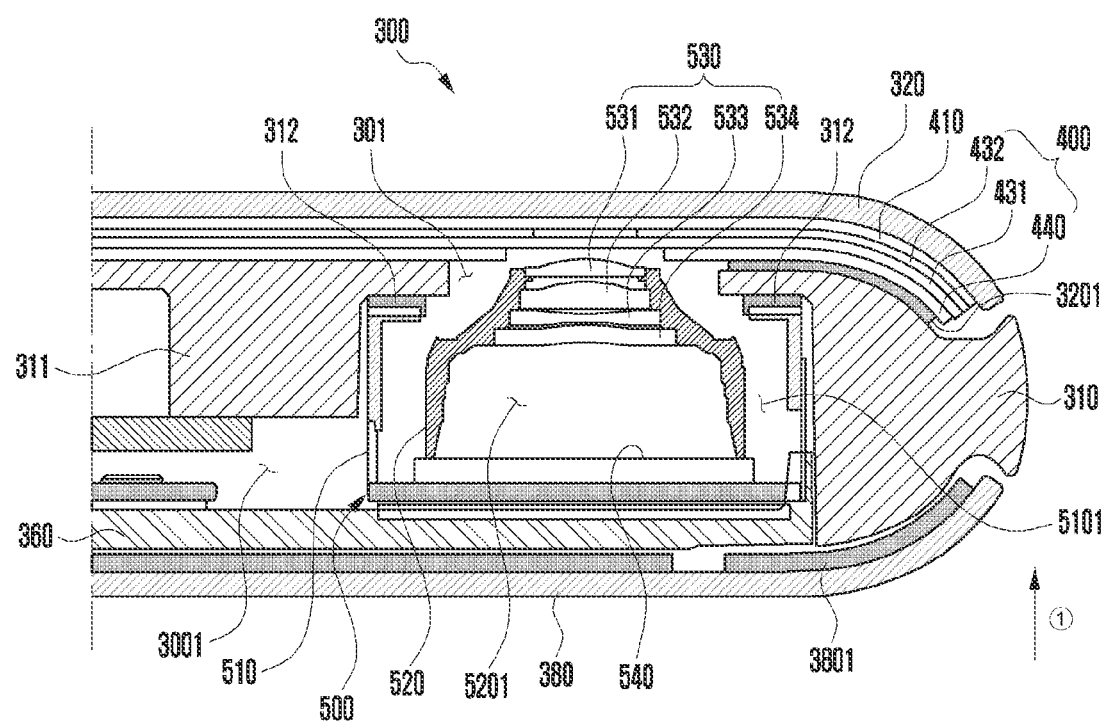
FIG. 5 is a cross-sectional view of an electronic device taken along line 5-5 of FIG. 1 according to various embodiments.

According to various embodiments, the subsidiary material layer 440 may include openings 4411, 4421, 4451, and 4441 formed at a position corresponding to a camera device (e.g., the camera device 500 of FIG. 5). According to an embodiment, the camera device 500 may be disposed close to the rear surface of the display panel 431 through the openings 4411, 4421, 4451, and 4441. According to an embodiment, the POL 432 or the touch panel 433 arranged above the display panel 431 may have positions which correspond to the camera device and through which openings 4321 and 4331 are perforated, in order to prevent and/or reduce performance degradation of the camera device 500 due to a refractive index thereof. As an embodiment, the positions of the POL 432 and/or the touch panel 433, which correspond to the camera device 500, may be processed to be transparent, or polarization characteristics thereof may be removed. As an embodiment, layers (e.g., the display panel 431 or the touch panel 433) having no opening may include a coating layer capable of index matching, in order to minimize and/or reduce the refractive index difference thereof. According to various embodiments, the display 400 may include an organic light-emitting diodes (OLED) display or a liquid crystal display (LCD).

According to various embodiments, an area (e.g., the first area A1 of FIG. 6B) of the display panel 431, which faces the openings 4411, 4421, 4451, and 4441, may be formed to have a predetermined transmissivity. The first area may be an area facing at least a part of a lens part (e.g., the lens part 530 of FIG. 5) included in the camera device (e.g., the camera device 500 of FIG. 5). Light outside the electronic device may pass through a display through the openings 4411, 4421, 4451, and 4441 and the first area, may enter the lens part of the camera device, and then may reach an image sensor of the camera device. In an embodiment, the transmissivity of the first area may be about 5% to 10%.

FIG. 5 is a cross-sectional view of an electronic device taken along line 5-5 of FIG. 1 according to various embodiments.

Referring to FIG. 5, although an unbreakable (UB) type OLED display (e.g., a curved display) is described as an example, it may not be limited thereto. For example, it may be also applied to a flat type display of an on-cell touch active matrix organic light-emitting diode (AMOLED) (OCTA) type.

Referring to FIG. 5, the electronic device 300 may include a front cover 320 (e.g., a cover member, a front plate, a front window, or a first plate) configured to face a first direction (the direction ①), a rear cover 380 (e.g., a rear cover member, a rear plate, a rear window, or a second plate) configured to face a direction opposite to the direction of the front cover 320, and a side member 310 configured to surround a space 3001 between the front cover 320 and the rear cover 380. According to an embodiment, the electronic device 300 may include a first waterproof member 3201 disposed between the subsidiary material layer 440 of the display 400 and the side member 310. According to an embodiment, the electronic device 300 may include a second waterproof member 3801 disposed between the side member 310 and the rear plate 380. The first waterproof member 3201 and the second waterproof member 3801 may prevent and/or reduce foreign materials or moisture from flowing into the inner space 3001 of the electronic device 300. As an embodiment, the waterproof member may be disposed on at least a part of a mounting support structure between the camera device 500 and the side member 310. As an embodiment, the first waterproof member 3201 and/or the second waterproof member 3801 may be replaced with an adhesive member.

According to various embodiments, the side member 310 may further include a first support member 311 configured to at least partially extend into the inner space 3001 of the electronic device 300. According to an embodiment, the first support member 311 may be formed by structural coupling with the side member 310. According to an embodiment, the first support member 311 may support the camera device 500 such that the camera device 500 is aligned and disposed near the rear surface of the display panel 431 through the openings (e.g., the openings 4411, 4421, 4451, 4441 of FIG. 4) of the subsidiary material layer 440 of the display 400.

According to various embodiments, the camera device 500 may include a camera housing 510, a lens housing 520 disposed in an inner space 5101 of the camera housing 510 and configured to at least partially protrude in a display direction (e.g., the direction ①), a lens part 530 including multiple lenses 531, 532, 533, and 534 arranged at predetermined intervals, in the inner space 5201 of the lens housing 520, and at least one image sensor 540 disposed to obtain at least a portion of light having passed through the lens part 530, in the inner space 5101 of the camera housing 510. According to an embodiment, when the camera device 500 includes an auto focus (AF) function, the lens housing 520 may be configured to move such that the distance from the display panel 431 is varied through a driving unit, in the camera housing 510. According to an embodiment, in order that the camera device 500 performs the AF function, a separate driving unit may be disposed to change the position of at least one of the lenses 531, 532, 533, and 534 included in the lens part 530. As an embodiment, in the camera device 500, the camera housing 510 may be omitted, and the lens housing 520 may be directly disposed on the first support member 311 through a predetermined alignment process. According to an embodiment, when the lens housing 520 is directly disposed on the first support member 311, in order to reduce the camera arrangement space, the camera housing 510 may be omitted, the lens housing 520 may be disposed to be attached to one side surface of the first support member 311. According to an embodiment, the camera device 500 may be aligned through a through-hole 301 of the first support member 311, and then may be attached to the rear surface of the first support member 311 by an adhesive member 312 (e.g., a bonding member or a tape member).

According to various embodiments, the display 400 may include a touch panel (e.g., the touch panel 433 of FIG. 4), the POL 432, the display panel 431, a light-blocking layer 441, a buffer layer (e.g., the buffer layer 442 of FIG. 4), a digitizer (e.g., the detection member 445 of FIG. 4), a functional member (e.g., the functional member 443 of FIG. 4), and/or a conductive member (e.g., the conductive member 444 of FIG. 4). Some of the elements of the display 400 described above may be omitted, and elements other than the described elements may be added thereto. For example, the POL 432 may be omitted. According to an embodiment, the camera device 500 may be supported by a second support member 360 (e.g., a rear case) which is additionally disposed in the inner space of an electronic device.

Figure 6A:
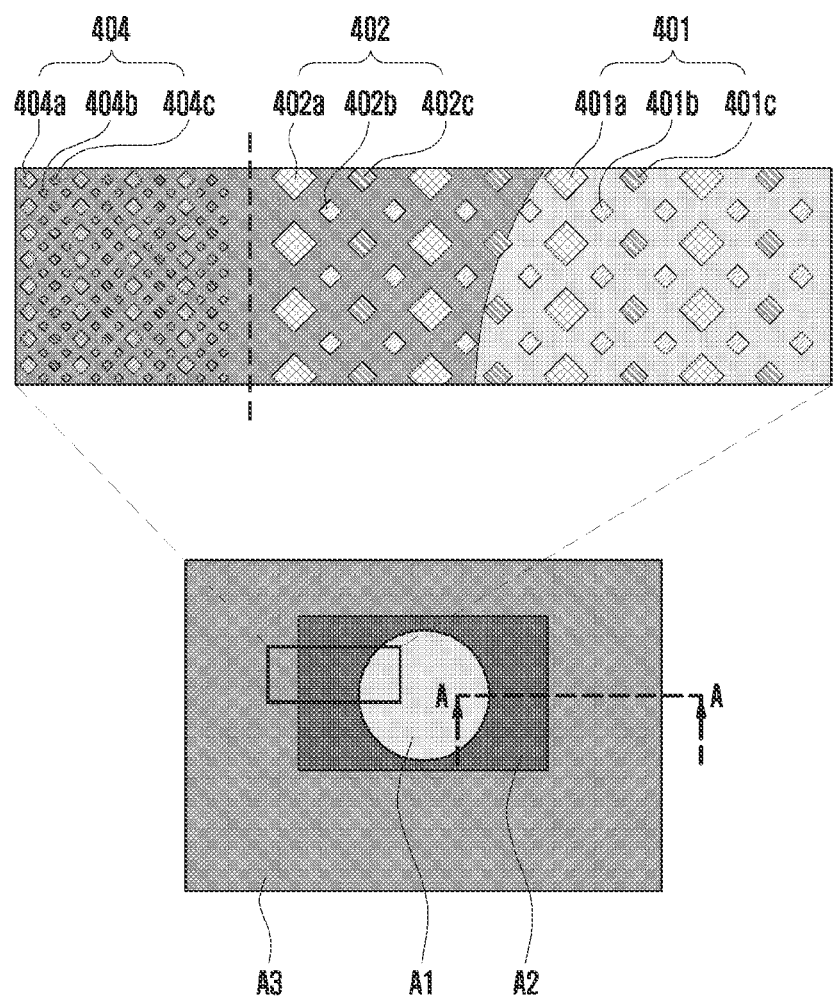
FIG. 6A is an enlarged view of a front camera portion of an electronic device according to various embodiments.
Figure 6B:
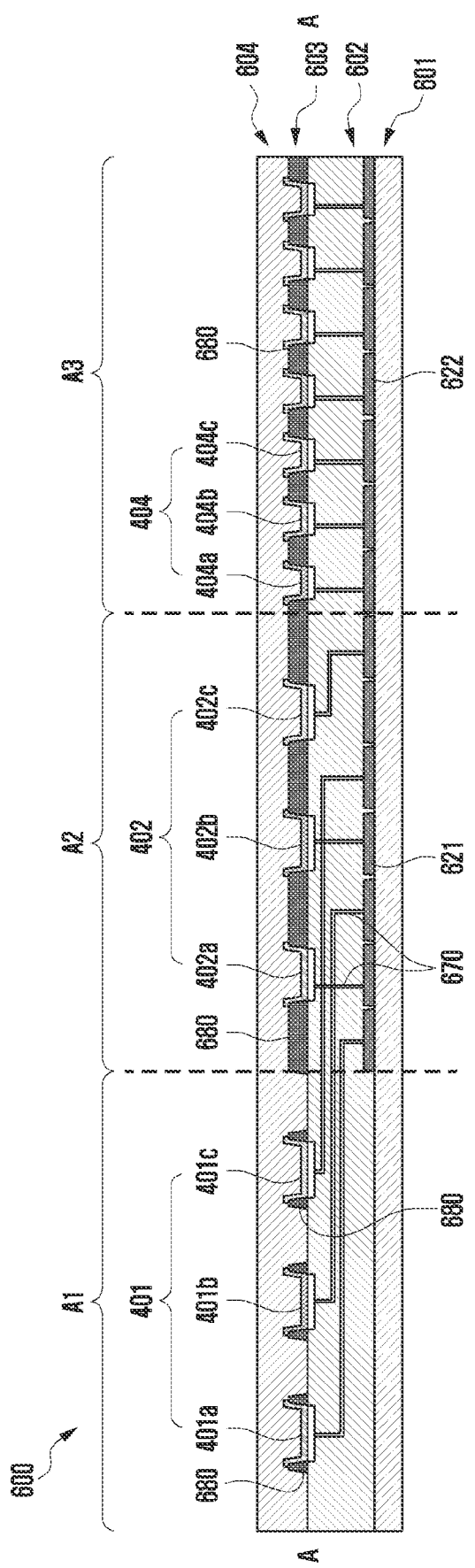
FIG. 6B is a cross-sectional view taken along line A-A of FIG. 6A according to various embodiments.

FIG. 6A is a diagram illustrating an enlarged view of a front camera portion of an electronic device according to various embodiments. FIG. 6B is a cross-sectional view taken along line A-A of FIG. 6A according to various embodiments. For example, the view of FIG. 6A may be understood as an enlarged view of the portion of the camera device 105 illustrated in FIG. 1.

FIG. 6A may be merely a schematic view illustrating light-emitting parts 401, 402, 404 and light-emitting bodies 401a, 401b, 401c, 402a, 402b, 402c, 404a, 404b, an 404c. The distance relationship (e.g., an interval) between the light-emitting parts and between the light-emitting bodies illustrated in FIG. 6A may be different from reality. For example, in FIG. 6A, although it is illustrated that an empty space exists between the light-emitting part 402 in a second area A2 and the light-emitting part 404 in a third area A3, it may be merely an empty space for convenience of explanation, and the light-emitting parts 402 and 404 may be disposed in the space as well.

Referring to FIG. 6B, a display panel 600 (e.g., the display panel 431 of FIG. 4) may include a substrate 601, a circuit layer 602, a light-emitting layer 603, and a protective layer 604.

For example, the substrate 601 of the display panel 600 may be formed of a glass substrate, a quartz substrate, or a transparent resin substrate. In the case, the transparent resin substrate may include polyimide-based resins, acryl-based resins, polyacrylate-based resins, polycarbonate-based resins, polyether-based resins, sulfonic acid-based resins, or polyethylene terephthalate-based resins.

In an embodiment, the circuit layer 602 may include multiple circuit parts 621 and 622 connected to the light-emitting layer 603. For example, the circuit parts 621 and 622 may include a thin film transistor (TFT) or a low temperature passivation transistor (LTPS). The circuit parts 621 and 622 may be electrically connected to the light-emitting part included in the light-emitting layer 603. The light-emitting part may be activated or deactivated through the circuit parts 621 and 622. An electrical signal for displaying a specific image may be transferred to the light-emitting layer 603 through the circuit parts 621 and 622, and thus some of the multiple light-emitting parts 401, 402, and 404 included in the light-emitting layer 603 may be deactivated and another some thereof may be activated, so that a display (e.g., the display 400 of FIG. 4) displays a specific image. In an embodiment, the circuit parts 621 and 622 may be electrically connected to the light-emitting parts 401, 402, and 404 through a transparent wire 670. The transparent wire 670 may refer, for example, to a wire having high light transmittance. For example, the transparent wire 670 may have a transmittance of about 80% or more with respect to a visible light area. The transparent wire 670 may be made of a material such as an indium tin oxide (ITO)-based material, a graphene material, or a conductive polymer material.

In an embodiment, the light-emitting layer 603 may include the multiple light-emitting parts 401, 402, and 404. Each of the multiple light-emitting parts 401, 402, and 404 may generate light of a specific wavelength. For example, the light-emitting parts 401, 402, and 404 may include first light-emitting bodies 401a, 402a, and 404a configured to generate visible light of a wavelength corresponding to red, second light-emitting bodies 401b, 402b, and 404b configured to generate visible light of a wavelength corresponding to green, and third light-emitting bodies 401c, 402c, and 404c configured to generate visible light of a wavelength corresponding to blue. For example, the light-emitting parts 401, 402, and 404 may be made of an organic light-emitting material including an organic material. For example, the light-emitting parts 401, 402, and 404 may include an organic light emitting diode (OLED) including a common layer and an organic light-emitting layer. The organic light-emitting layer may be disposed between one pair of vertically laminated common layers. According to an embodiment, the one common layer may include a hole injection layer (HIL) and/or a hole transport layer (HTL). According to an embodiment, the other common layer may include an electron transport layer (ETL) and/or an electron injection layer (EIL). In addition, the light-emitting parts 401, 402, and 404 may be replaced with various elements capable of generating light.

In an embodiment, the light-emitting layer 603 may include a pixel define layer 680. The pixel define layer 680 may be made of a material having high light absorption. Referring to FIG. 6B, the pixel define layers 680 may be disposed between the light-emitting bodies 401a, 401b, 401c, 402a, 402b, 402c, 404a, 404b, and 404c. The pixel define layers 680 may distinguish between the light-emitting bodies 401a, 401b, 401c, 402a, 402b, 402c, 404a, 404b, and 404c which generate light of different wavelengths.

The protective layer 604 may be laminated on the light-emitting layer 603 to protect the light-emitting parts 401, 402, and 404 included in the light-emitting layer 603. The protective layer 604 may be formed of a synthetic resin material having an insulating property. In an embodiment, the thicknesses of the light-emitting layer 603 may be different from each other in each portion thereof. For example, in a portion corresponding to the light-emitting parts 401, 402, and 404 and a portion corresponding to the pixel define layer 680, the thicknesses of the light-emitting layer 603 may have different from each other. In consideration of the thickness difference, the protective layer 604 may be laminated on the light-emitting layer 603. For example, the protective layer 604 may be laminated at a thicker thickness on a portion having a thin thickness so that the thickness difference of the light-emitting layer 603 is compensated.

The display may include multiple pixels. A pixel may be a basic unit of a digital image, and one pixel may include multiple sub-pixels configured to emit light of a specific wavelength. For example, the sub-pixel may emit light corresponding to red, green, or blue. The light-emitting parts 401, 402, and 404 described above may be understood as one element of one pixel, and the first light-emitting bodies 401a, 402a, and 404a, the second light-emitting bodies 401b, 402b, and 404b, and the third light-emitting bodies

401c, 402c, and 404c respectively included in the light-emitting parts may be understood as one element of a sub-pixel of a pixel.

Hereinafter, a "display activation state" may refer, for example, to a state in which a pixel included in the display panel 600 emits light, and a "display inactivation state" may refer, for example, to a state in which a pixel included in the display panel 600 does not emit light. For example, in a case where a pixel is configured to individually emit light by an electrical signal, a specific area of a display may be partially activated or deactivated.

Referring to FIG. 6A, the display panel 600 may include the first area A1, the second area A2, and the third area A3. The area division of the display panel 600 may be by a difference in the configuration of the light-emitting layer 603 and the circuit layer 602 included in each area. The first area A1 may be an area facing the lens part (e.g., the lens part 530 of FIG. 5) of the camera device (e.g., the camera device 500 of FIG. 5) disposed on the rear surface of the display. The second area A2 may be an area adjacent to the first area A1. The third area A3 may be the remaining areas other than the first area A1 and the second area A2.

The first area A1 may be an area having relatively high transmittance with respect to light compared to other areas (the second area A2 and the third area A3). In addition, the first area A1 may be an area facing the openings (e.g., the openings 4411, 4421, 4451, 4441 of FIG. 4) formed through the subsidiary material layer (e.g., the subsidiary material layer 440 of FIG. 4) of the display. The first area A1 may be an area in which the lens part of the camera device faces. Since the camera device recognizes light incident through the first area A1 and then operates, it may be required that the first area A1 is configured to have high transmittance with respect to light. The circuit parts 621 and 622 may not be disposed in the first area A1. The circuit parts 621 and 622 having not high transmittance with respect to light may be removed from the first area A1 to improve the transmittance of the first area A1.

The first light-emitting part 401 may be disposed in the first area A1. That is, the first light-emitting part 401 may be a light-emitting part disposed in the first area A1. The first light-emitting part 401 may include multiple light-emitting bodies 401a, 401b, and 401c. The multiple light-emitting bodies 401a, 401b, and 401c may generate light of a red wavelength, a green wavelength, and a blue wavelength, respectively. In an embodiment, the circuit parts 621 and 622 may not be arranged in the first area A1, and thus the first light-emitting part 401 disposed in the first area A1 may be electrically connected to is the circuit part 621 disposed in the second area A2.

In an embodiment, the density of pixels in the first area A1 may be less than that of the third area A3. For example, the number of the light-emitting bodies 401a, 401b, and 401c included in the first light-emitting part 401 may be smaller than the number of the light-emitting bodies 404a, 404b, and 404c included in a fourth light-emitting part 404 disposed in the third area A3. In addition, between the light-emitting bodies 401a, 401b, and 401c included in the first light-emitting part 401, the pixel define film 680 may be partially removed in consideration of transmissivity of light. Referring to FIG. 6B, light may travel to the space between the light-emitting bodies 401a, 401b, and 401c arranged in the first area A1, and then may reach the camera device disposed on the rear surface of the display. Meanwhile, the first light-emitting part 401 may be also disposed in the first area A1, and thus visual information may be displayed through the first area A1 when the display is in an activated state.

Accordingly, when the display is in an activated state, the difference in a visual impression between the first area A1 and the remaining areas may not be large. Referring to FIG. 6B, the size of the first light-emitting part 401 included in the first area A1 may be larger than the size of the fourth light-emitting part 404 included in the third area A3. The size of the light-emitting part may refer, for example, to the sizes of the light-emitting bodies included in the light-emitting part. As described above, the number of the light-emitting bodies 401a, 401b, and 401c included in the first light-emitting part 401 is smaller than the number of light-emitting bodies 404a, 404b, and 404c included in the fourth light-emitting part 404. However, since the size of the first light-emitting part 401 is larger than the size of the fourth light-emitting part 404, the difference in the light amount between the first light-emitting part 401 and the fourth light-emitting part 404 may not be large. Accordingly, when the display is in an activated state, the difference in the light amount between the first area A1 and the third area A3 may be reduced.

In an embodiment, between the first light-emitting parts 401, a portion, from which the pixel define layer 680 is partially removed, may include the light-emitting layer 603 thinner than other portions. In order to compensate for the step difference due to the thickness difference therebetween, the more amount of a material may be used in the portion from which the pixel define layer 680 is removed, and thus the protective layer 604 laminated on the corresponding portion may be thicker.

The fourth light-emitting part 404 may be disposed in the third area A3. The fourth light-emitting part 404 may be electrically connected to the circuit part 622 disposed in the third area A3.

A second light-emitting part 402 may be disposed in the second area A2. The second light-emitting part 402 may be electrically connected to the circuit part 621 disposed in the second area A2. Some of the circuit part 621 disposed in the second area A2 may be connected to the first light-emitting part 401 disposed in the first area A1. Therefore, as illustrated in FIG. 6B, the number of the light-emitting bodies 402a, 402b, and 402c included in the second light-emitting part 402 arranged in the second area A2 may be smaller than the number of the light-emitting bodies 404a, 404b, and 404c included in the fourth light-emitting part 404 disposed in the third area A3. As described above, the number of the light-emitting bodies 402a, 402b, and 402c arranged in the second area A2 and the number of light-emitting bodies 404a, 404b, and 404c arranged in the third area A3 may be different from each other. Therefore, when the display is in an inactivaton state, or when the second area A2 and third area A3 are in an inactivated state, the visual sensations of the second area A2 and the third area A3 may be different from each other. When the display is in an inactivated state, the visual sensation of the display may be affected by reflectance by elements included in the display. The numbers of light-emitting bodies included in the second area A2 and the third area A3 may be different from each other, and thus the reflectances of the second area A2 and the third area A3 may be different from each other. Therefore, as illustrated in FIG. 6A, a difference in the visual sensation between the second area A2 and the third area A3 may occur.

Figure 7A:
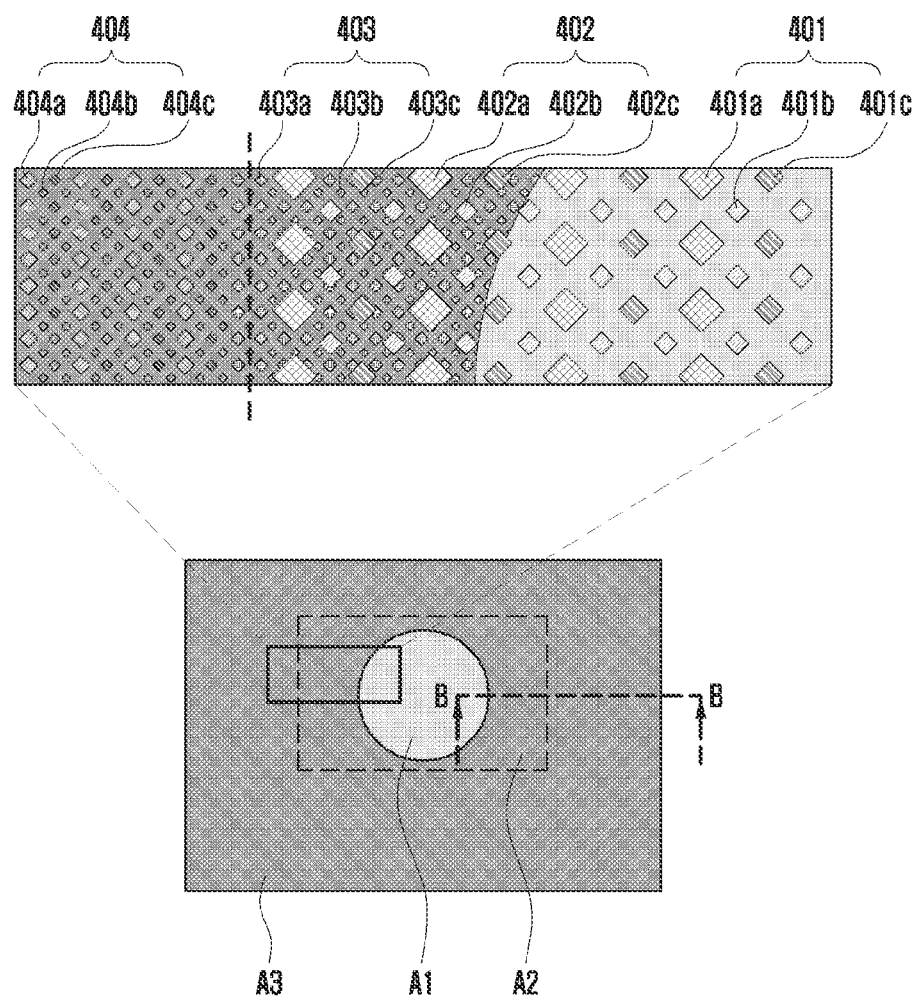
FIG. 7A is an enlarged view of a front camera portion of an electronic device according to various embodiments.
Figure 7B:
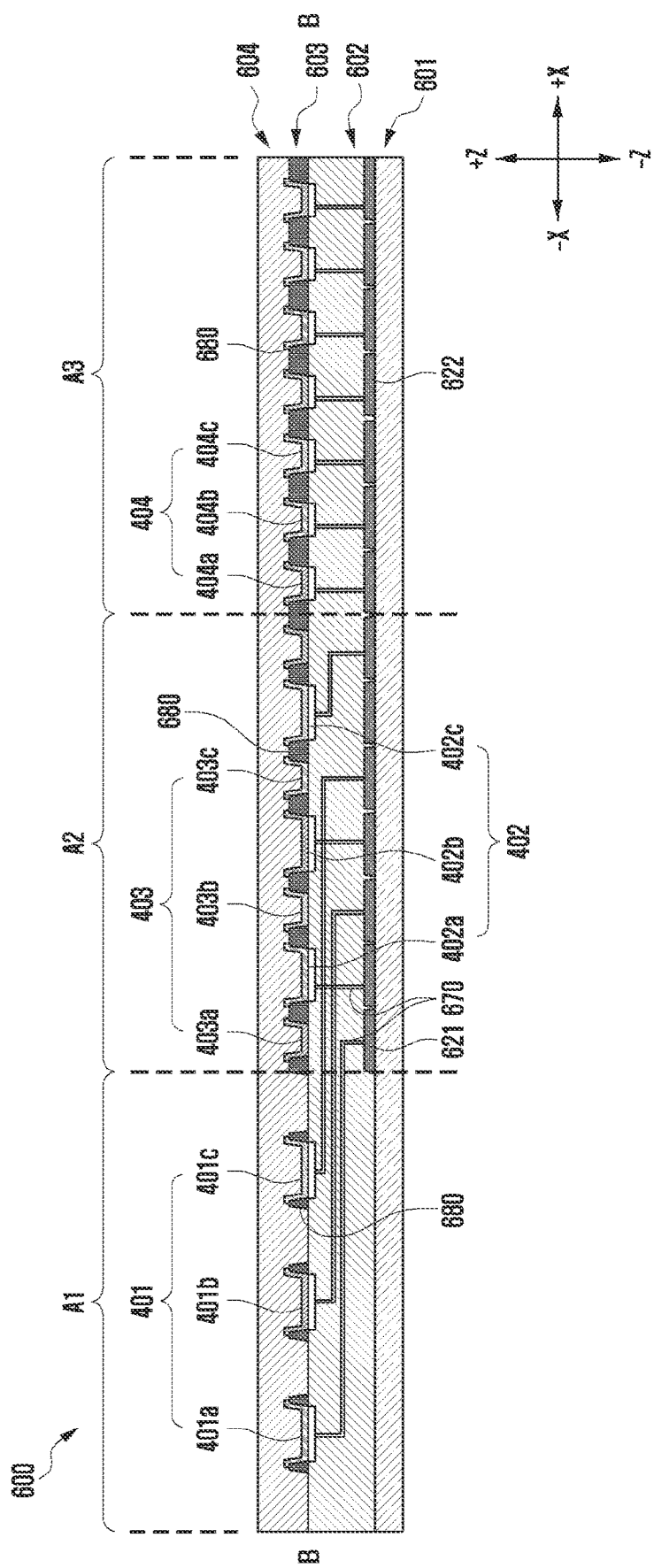
FIG. 7B is a cross-sectional view taken along line B-B of FIG. 7A according to various embodiments.

FIG. 7A is a diagram illustrating an enlarged view of a front camera portion of an electronic device according to various embodiments. FIG. 7B is a cross-sectional view taken along line B-B of FIG. 7A according to various embodiments. For example, the view of FIG. 7A may be understood as an enlarged view of the portion of the camera device 105 illustrated in FIG. 1.

FIG. 7A may be merely a schematic view illustrating the light-emitting parts 401, 402, and 404, the light-emitting bodies 401a, 401b, 401c, 402a, 402b, 402c, 404a, 404b, and 404c, a dummy light-emitting part 403, and dummy light-emitting bodies 403a, 403b, 403c. The distance relationship (e.g., an interval) between the light-emitting parts and between the light-emitting bodies illustrated in FIG. 7A may be different from reality. Although FIG. 7A illustrates that the second light-emitting part 402 and the dummy light-emitting part 403 partially overlap each other, as illustrated in FIG. 7B, the second light-emitting part 402 and the dummy light-emitting part 403 may be spaced apart from each other with a predetermined interval and thus may not overlap each other. For example, in the second area A2, the distance relationship between the dummy light-emitting bodies 403a, 403b, and 403c included in the dummy light-emitting part 403 and the second light-emitting bodies 402a, 402b, and 402c included in the second light-emitting part 402, and the arrangement therebetween may be the same. In other words, in all portions of the second area A2, the distance relationship between the dummy light-emitting bodies 403a, 403b, and 403c and the second light-emitting bodies 402a, 402b, and 402c, and the arrangement therebetween may be substantially the same. The second area A2 may be an area in which a unit pixel including the second light-emitting bodies 402a, 402b, and 402c and the dummy light-emitting bodies 403a, 403b, and 403c is disposed. Therefore, the distance relationship between the second light-emitting bodies 402a, 402b, and 402c and the dummy light-emitting bodies 403a, 403b, and 403c, and the arrangement therebetween may be substantially the same, in all portions of the second area A2.

The embodiment illustrated in FIG. 7A and FIG. 7B may be an embodiment for addressing the problem of the embodiment of FIG. 6A and FIG. 6B. Through the embodiment described below, when the display is in an inactivated state, the differences in a visual sensation of perimeter parts of the camera device may be reduced. In the below description, in connection with elements which are substantially identical or similar to those of FIG. 6A and FIG. 6B, the same reference numerals may be used, and detailed descriptions thereof may not be repeated.

According to various embodiments disclosed herein, in order to reduce the difference in a visual sensation between the second area A2 and the third area A3 when the display (e.g., the display 400 of FIG. 4) is in an inactivated state, the dummy light-emitting part 403 may be disposed in the second area A2.

Referring to FIG. 7B, the dummy light-emitting part 403 may be disposed in the second area A2, and may be disposed in the second light-emitting parts 402 disposed in the second area A2. For example, the dummy light-emitting bodies 403a, 403b, and 403c included in the dummy light-emitting part 403 may be arranged between the light-emitting bodies 402a, 402b, 402c included in the second light-emitting part 402. In various embodiments, two or more of the dummy light-emitting bodies 403a, 403b, and 403c included in the dummy light-emitting part 403 may be arranged between the light-emitting bodies 402a, 402b, 402c included in the second light-emitting part 402. The dummy light-emitting part 403 may be a dummy light-emitting part not connected to the circuit part 621 disposed in the second area A2. The dummy light-emitting part 403 may not be connected to the circuit part 621, and thus may always maintain an inactivated state (a state in which no light is generated). In an embodiment, the dummy light-emitting part 403 may include the same structure as the second light-emitting part 402 except for that same is not connected to the circuit part 621. For example, the dummy light-emitting part 403 may include the same or a similar laminated structure (e.g., a laminated structure including a common layer and an organic light-emitting layer) as or to the second light-emitting part 402. In various embodiments, the dummy light-emitting part 403 may have a similar visual sensation of the second light-emitting part 402, but may include a different structure.

When the display is in an inactivated state, a visual sensation may be mainly determined by the reflectance by elements arranged on the display. In the second area A2, the dummy light-emitting part 403 may be disposed between the second light-emitting parts 402. Therefore, the difference between the area occupied by the light-emitting part (the second light-emitting part 402 and the dummy light-emitting part 403) in the second area A2 and the area occupied by the fourth light-emitting part 404 in the third area A3 may be reduced compared to the embodiment illustrated in FIG. 6A and FIG. 6B. Therefore, the difference in reflectance between the second area A2 and the third area A3 may be reduced. Accordingly, as illustrated in FIG. 7A, the difference in a visual sensation between the second area A2 and the third area A3 may occur when the display is an inactivated state.

In an embodiment, the arrangements of the light-emitting bodies 402a, 402b, 402c of the second light-emitting part 402 and the dummy light-emitting bodies 403a, 403b, 403c of the dummy light-emitting part 403 may be arranged similar to the arrangement of the light-emitting bodies 404a, 404b, and 404c included in the fourth light-emitting part 404 disposed in the third area A3. For example, in the third area A3, the light-emitting bodies 404a, 404b, and 404c included in the fourth light-emitting part 404 may be arranged in the order of the light-emitting bodies which generate light in the blue-red-green order along the X-axis direction of FIG. 7B. In addition, in the second area A2, the dummy light-emitting bodies included in the second light-emitting part 402 and the dummy light-emitting part 403 may be arranged in the order of the dummy light-emitting bodies which are configured to generate light in the blue-red-green order along the X-axis direction of FIG. 7B (however, the dummy light-emitting bodies may not be connected to the circuit part 621, and thus cannot actually generate light due to no energy supply). Accordingly, when the display is in an inactivated state, the first area A2 and the third area A3 may be similar in a visual sensation.

In an embodiment, the dummy light-emitting part 403 may have a size smaller than the second light-emitting part 402. The dummy light-emitting part 403 may be a dummy light-emitting part which does not generate light. Therefore, the dummy light-emitting part 403 may be formed to have a smaller size than the second light-emitting part 402 configured to generate light. In addition, the second light-emitting part 402 may have a size larger than the fourth light-emitting part 404. Accordingly, when the display is in an activated state, the difference in the light amount between the second area A2 and the third area A3 may be reduced.

In an embodiment, the size of the dummy light-emitting part 403 may be substantially identical to the size of the fourth light-emitting part 404. In addition, the size of the dummy light-emitting part 403 may be variously changed.

Figure 8A:
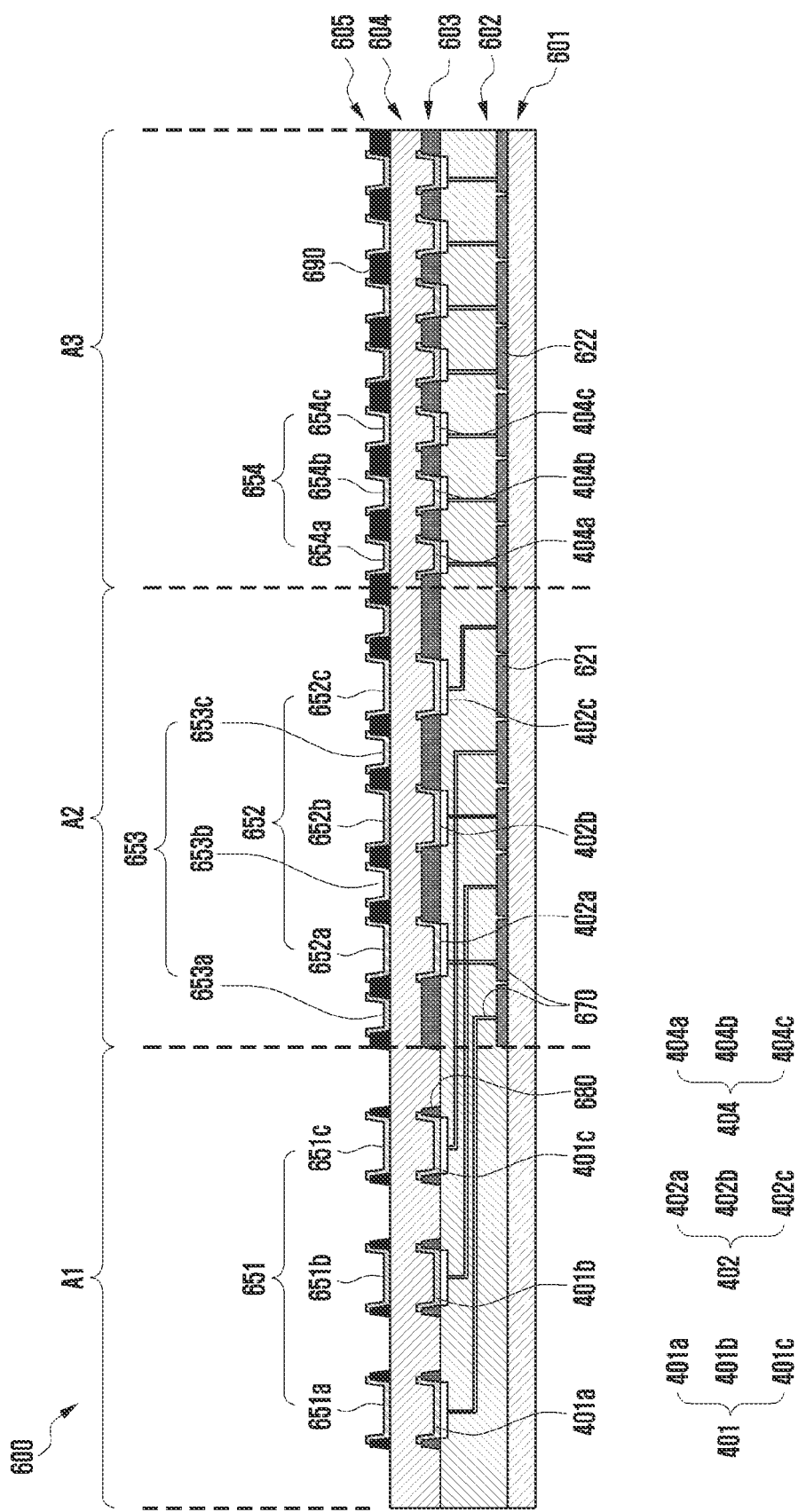
FIG. 8A is a cross-sectional view of a display panel according to various embodiments.
Figure 8B:
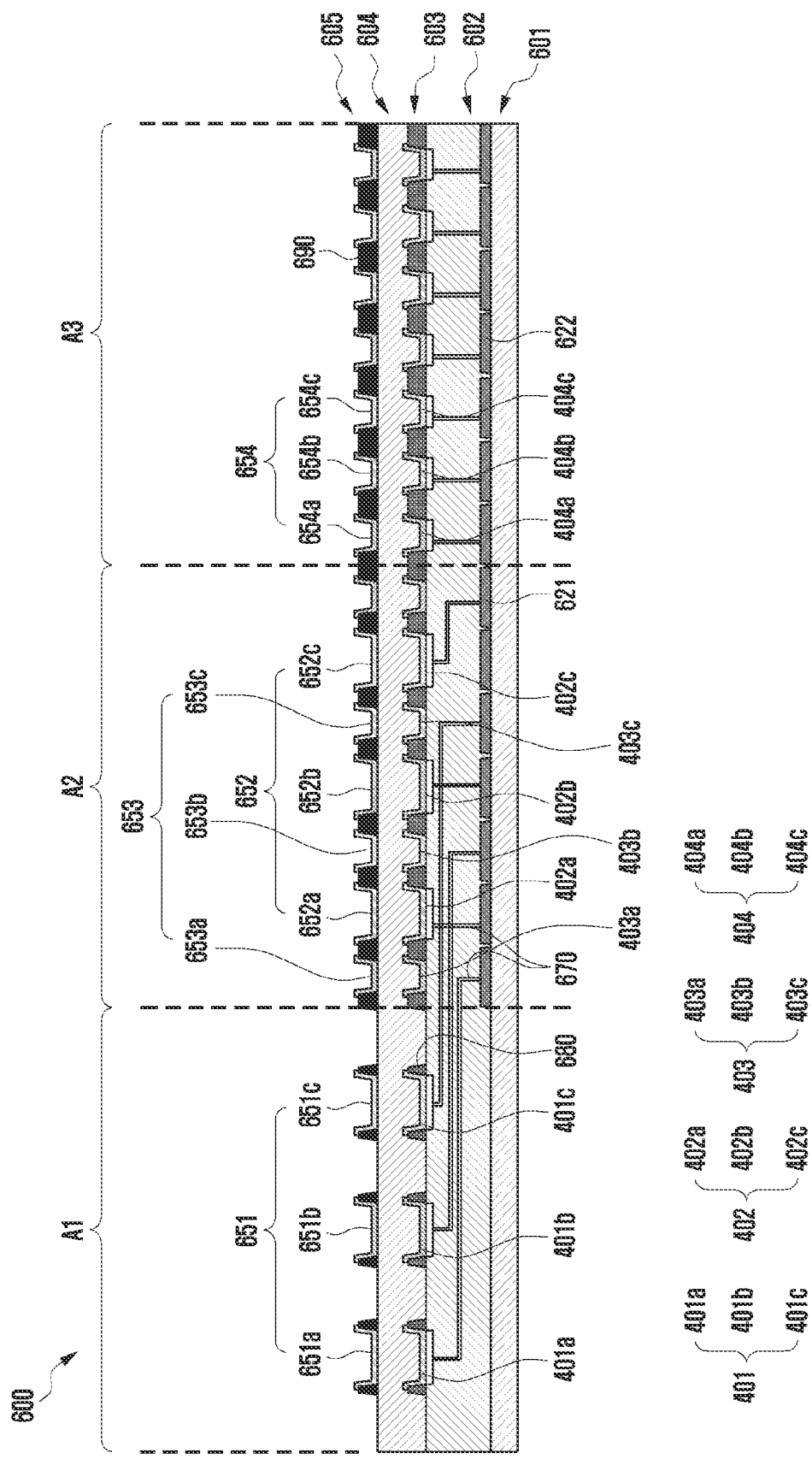
FIG. 8B is a cross-sectional view of one of a display panel according to various embodiments.
Figure 8C:
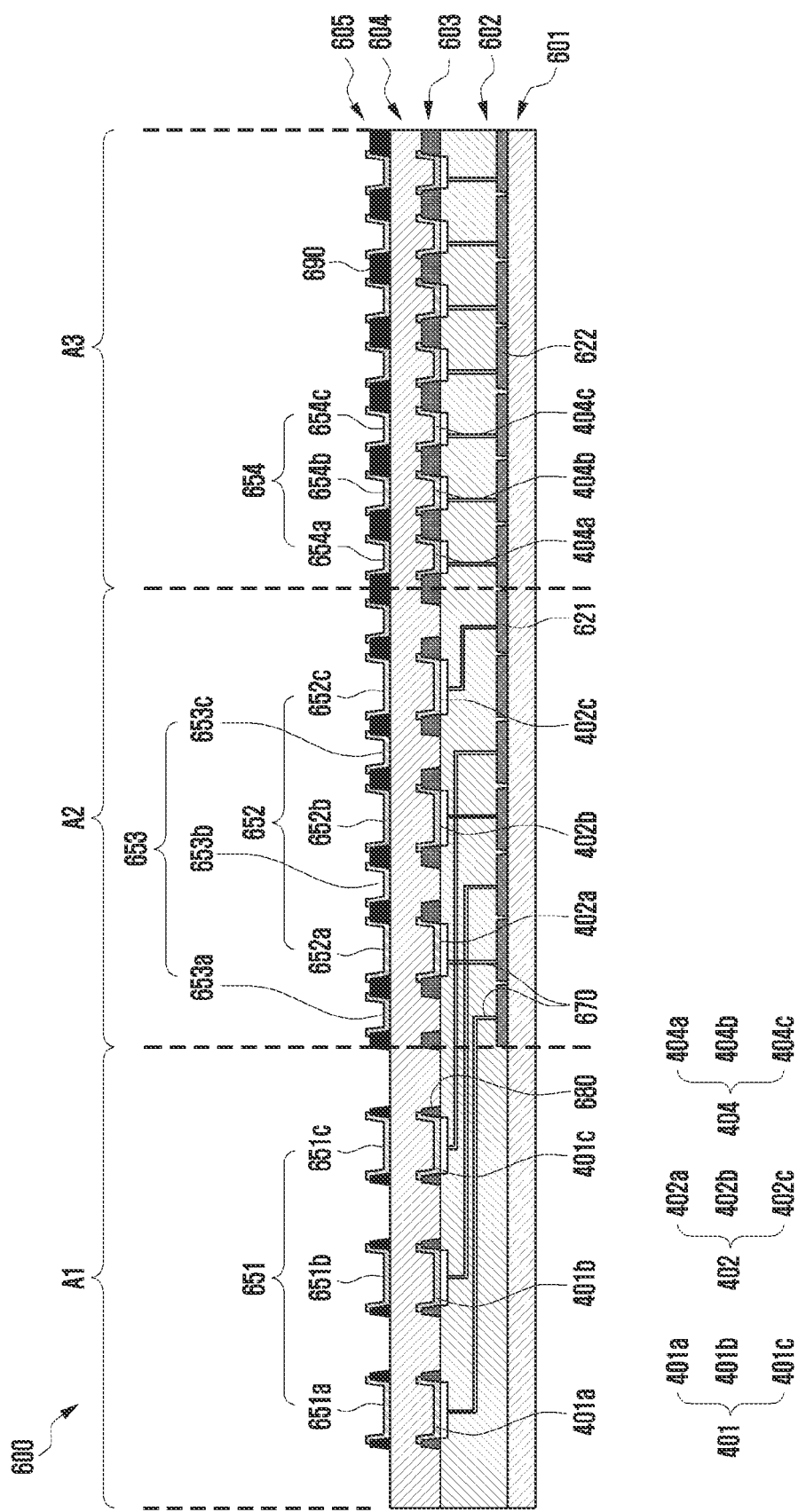
FIG. 8C is a cross-sectional view of a display panel according to various embodiments.

FIG. 8A is a cross-sectional view of a display panel according to various embodiments. FIG. 8B is a cross-sectional view of a display panel according to various embodiments. FIG. 8C is a cross-sectional view of a display panel according to various embodiments.

In the below description, in connection with elements which are identical or similar to elements described through FIGS. 6A, 6B, 7A, and 7B, the same member numerals may be used, and detailed descriptions thereof may not be repeated.

According to various embodiments, the display panel 600 may include a substrate 601, a circuit layer 602, a light-emitting layer 603, and a protective layer 604 as described in FIG. 6B and FIG. 7B. In addition, the display panel 600 may further include a transmission layer 605. The transmission layer 605 may include multiple transmission parts 651, 652, 653, and 654 configured to transmit light.

The transmission layer 605 may be laminated on the protective layer. For example, the transmission layer 605 may be a color filter configured to transmit light of a specific wavelength. As illustrated in FIG. 8A to FIG. 8C (which may be referred to as FIGS. 8A, 8B and 8C), a first transmission part 651 may be disposed in the first area A1 of the display panel 600, a second transmission part 652 and a third transmission part 653 may be disposed in the second area A2, and a fourth transmission part 654 may be disposed in the third area A3. The transmission layer 605 may include a blocking member 690 formed of a material having a high light absorptivity. The blocking members 690 may be arranged between the transmission bodies 651a, 651b, 651c, 652a, 652b, 652c, 653a, 653b, 653c, 654a, 654b, and 654c included in the transmission parts 651, 652, 653, and 654. The blocking member 690 may include a black matrix (BM) and a pixel define layer (PDL). In various embodiments, the blocking member 690 may be formed of the same material as the pixel define layer film 680 of the light-emitting layer 603.

In an embodiment, the transmission parts 651, 652, 653, and 654 may include multiple transmission bodies 651a, 651b, 651c, 652a, 652b, 652c, 653a, 653b, 653c, 654a, 654b, and 654c which are configured to transmit light of different wavelengths. For example, first transmission bodies 651a, 652a, 653a, and 654a may transmit light corresponding to a red-based wavelength, second transmission bodies 651b, 652b, 653b, and 654b may transmit light corresponding to a green-based wavelength transmit, and third transmission bodies 651c, 652c, 653c, and 654c may transmit light corresponding to a blue-based wavelength. The transmission bodies 651a, 651b, 651c, 652a, 652b, 652c, 653a, 653b, 653c, 654a, 654b, and 654c may be arranged to respectively face the light-emitting bodies 401a, 401b, 401c, 402a, 402b, 402c, 403a, 403b, 403c, 404a, 404b, 404c which generate light of the same or a similar wavelength. For example, when the first light-emitting bodies 401a, 402a, 403a, and 404c generate light corresponding to a red-based wavelength, the first transmission bodies 651a, 652a, 653a, and 654 arranged at a position facing the first light-emitting bodies 401a, 402a, 403a, and 404c may be configured to transmit light corresponding to a red-based wavelength. When the second light-emitting bodies 401b, 402b, 403b, and 404b generate light corresponding to a green-based wavelength, the second transmission bodies 651b, 652b, 653b, and 654 arranged at a position facing the second light-emitting bodies 401b, 402b, 403b, and 404b may be configured to transmit light corresponding to a green-based wavelength. When the third light-emitting bodies 401c, 402c, 403c, and 404c generate light corresponding to a blue-based wavelength, the third transmission bodies 651c, 652c, 653c, and 654c arranged at a position facing the third light-emitting bodies 401c, 402c, 403c, and 404c may be configured to transmit light corresponding to a blue-based wavelength.

In the display panel 600 including the transmission parts 651, 652, 653, and 654, when the display is in an off state, a visual sensation may be affected by the reflectance of the transmission parts 651, 652, 653, and 654, and thus may be determined by the area of the transmission parts 651, 652, 653, and 654. When the transmission parts 651, 652, 653, and 654 are similarly arranged in the second area A2 and the third area A3 and the display is in an off state, the difference in the visual sensation between the second area A2 and the third area A3 may be reduced.

In the first area A1, the first transmission part 651 may be disposed at a position facing the first light-emitting part 401. In an embodiment, the size of the first transmission part 651 may be substantially identical to or larger than the size of the first light-emitting part 401.

In the second area A2, the second transmission part 652 may be disposed at a position facing the second light-emitting part 402. The third transmission part 653 may be disposed at an area facing the dummy light-emitting part 403. In an embodiment, the size of the second transmission part 652 may be substantially identical to or larger than the size of the second light-emitting part 402. The size of the third transmission part 653 may be substantially identical to or larger than the size of the dummy light-emitting part 403. The third transmission part 653 may be disposed between the dummy light-emitting parts 652. For example, the transmission bodies 653a, 653b, and 653c included in the third transmission part 653 may be arranged between the transmission bodies 652a, 652b, and 652c included in the second transmission part 652. In various embodiments, two or more of the transmission bodies 653a, 653b, and 653c included in the third transmission part 653 may be arranged between the transmission bodies 652a, 652b, and 652c included in the second transmission part 652. In an embodiment, as illustrated in FIG. 8A to FIG. 8C, when the size of the second light-emitting part 402 is larger than the size of the dummy light-emitting part 403, the size of the second transmission part 652 may also be larger than the size of the third transmission part 653.

In the third area A3, the fourth transmission part 654 may be disposed at a position facing the fourth light-emitting part 404.

The sum of areas occupied by the second transmission part 652 and the third transmission part 653 in the second area A2 may be configured similarly to the sum of areas occupied by the fourth transmission part 654 in the third area A3. When the display is in an activated state, the difference in a visual sensation between the second area A2 and the third area A3 may be reduced.

When the display panel 600 includes the transmission parts 651, 652, 653, and 654, the light-emitting layer 603 may be variously configured. For example, as illustrated in FIG. 8A, the dummy light-emitting part 403 may be omitted from the second area A2, and the part corresponding thereto may be filled with a pixel define layer 680. In addition, as illustrated in FIG. 8B, the dummy light-emitting part 403 may be disposed in the second area A2, and the third transmission part 653 may be disposed in an area facing the dummy light-emitting part 403. In addition, as illustrated in FIG. 8C, only the second light-emitting part 402 may be disposed in the second area A2, and a part of the pixel define layer 680 between the second light-emitting parts 402 may be removed therefrom. The third transmission part 653 may be disposed to face the portion from which the pixel define layer 680 is partially removed.

In an embodiment, when the display panel 600 includes the transmission layer 605, the display may not include the POL (e.g., the POL 432 of FIG. 4). The POL may be an element configured to block light reflected from the display. Although light is partially reflected from the display panel 600, only light of a specific wavelength may pass through by the transmission parts 651, 652, 653, and 654, and may visually recognized from the outside. The wavelength of light having passed through the transmission parts 651, 652, 653, and 654 and the wavelength of light generated by the light-emitting parts 401, 402, 403, and 404 may be identical or similar to each other. Therefore, in a state where the POL is omitted therefrom, the problem of deterioration of visibility of visual information displayed by light reflected from the display can be addressed.

Figure 9A:
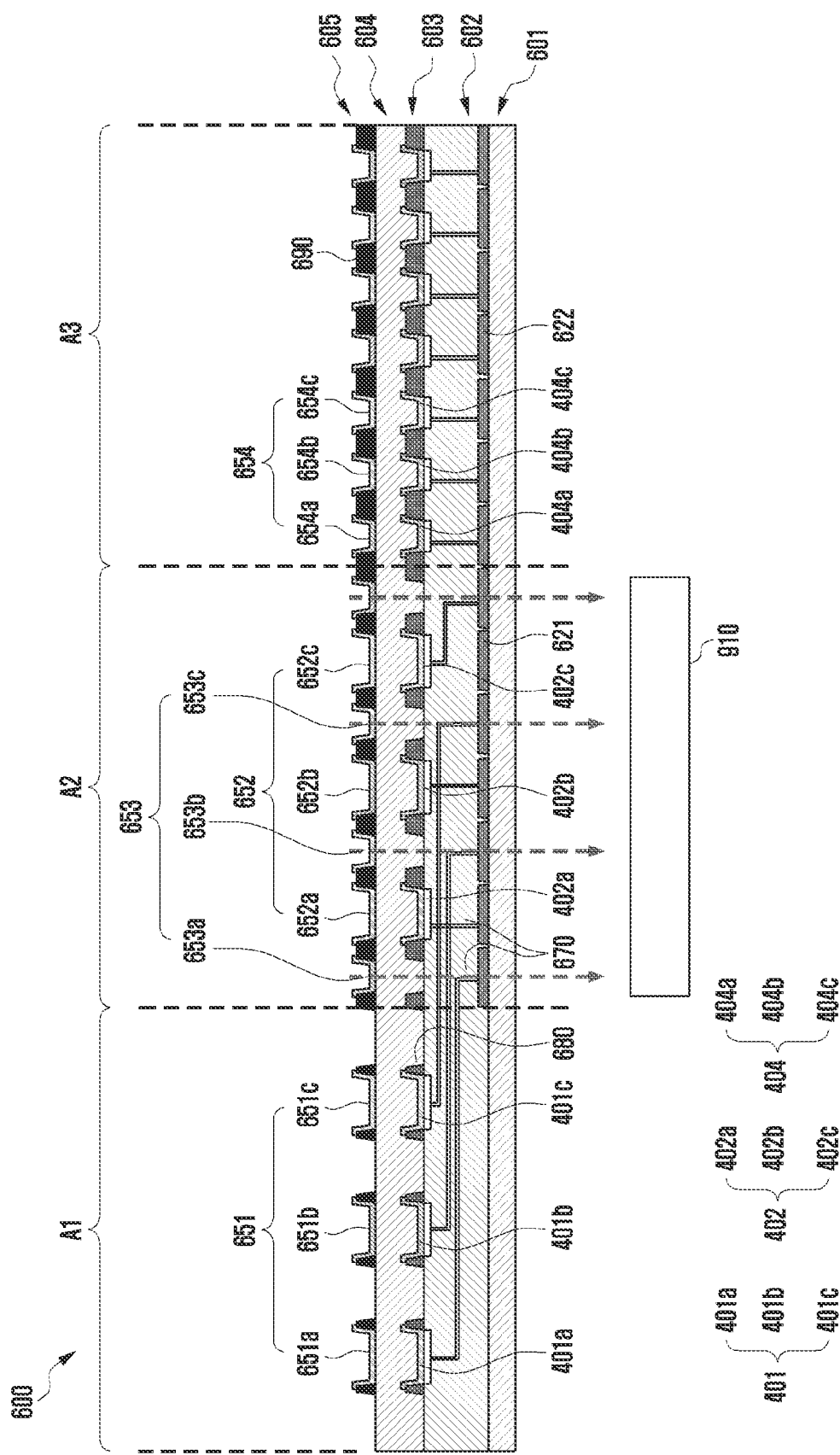
FIG. 9A and FIG. 9B are cross-sectional views illustrating an arrangement relationship between an optical sensor and a display according to various embodiments.
Figure 9B:
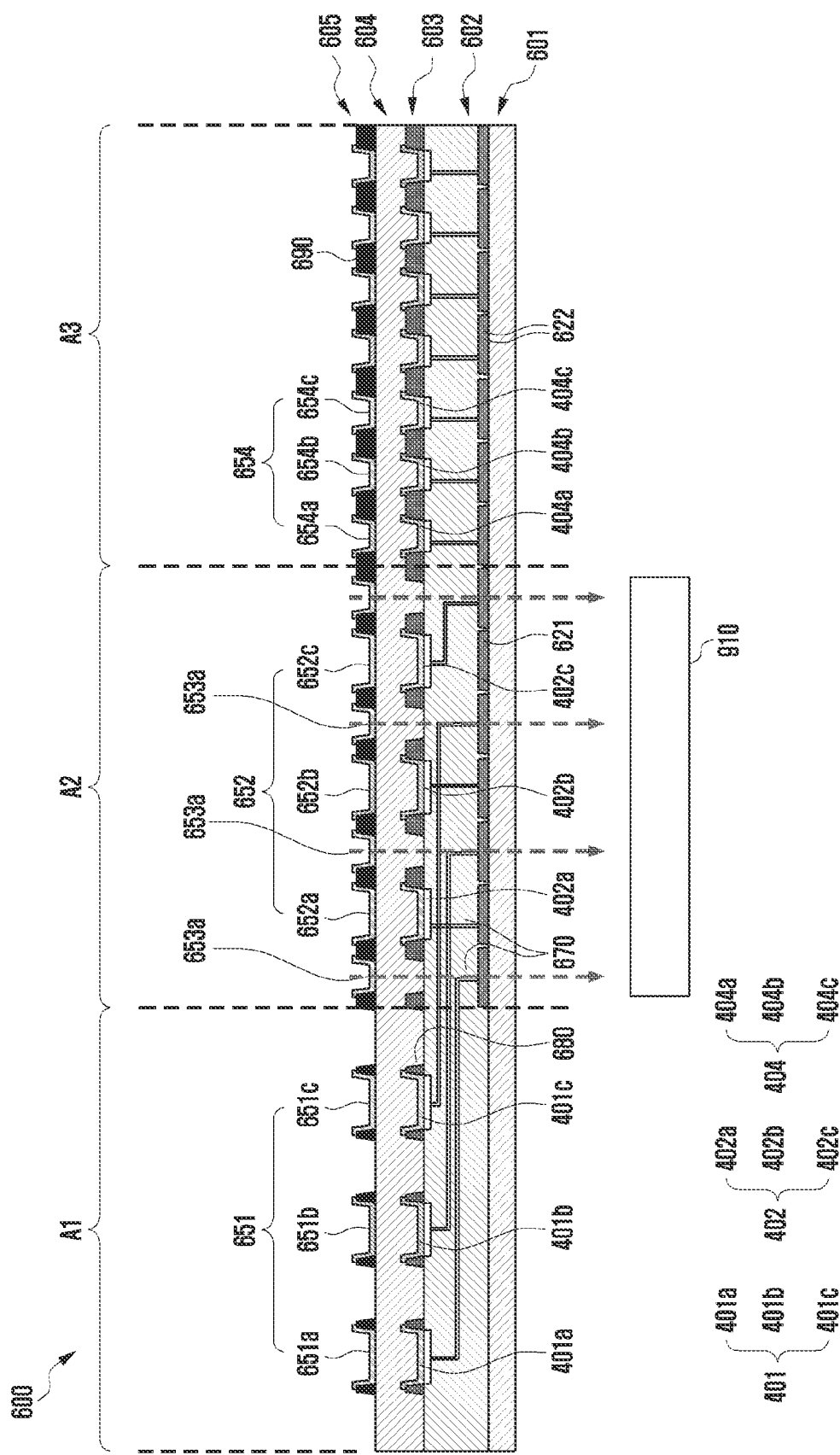

FIG. 9A and FIG. 9B are cross-sectional views illustrating an arrangement relationship between an optical sensor and a display according to various embodiments.

The embodiment of FIG. 9A and FIG. 9B may be similar to the embodiment described in FIG. 8C, and thus descriptions for the same and similar elements may not be repeated.

As illustrated in FIG. 9A and FIG. 9B, in a case where only the second light-emitting part 402 is disposed in the second area A2 and the pixel define layer 680 is removed from the second light-emitting part 402, light outside the electronic device may pass through the third transmission part 653 and then may travel through the second light-emitting part 402 of the second area A2. Referring to FIG. 9A and FIG. 9B, an optical sensor 910 may be disposed on the rear surface of the display such that at least a part thereof faces the second area A2. The optical sensor 910 may be a sensor configured to receive light outside the electronic device, and may include a sensor such as a proximity sensor and an illuminance sensor using external light. In some cases, a sensor configured to confirm user's biometric information (e.g., skin-related information, heart-related information, etc.) using light may be included therein. Light outside the electronic device may pass through the third transmission part 653, and some of the passed light may travel between the second light-emitting parts 402 and then may reach the optical sensor 910. Accordingly, the optical sensor 910 disposed to face the second area A2 may receive light outside the electronic device and then may operate.

In an embodiment, as illustrated in FIG. 9B, the third transmission part 653 disposed in the second area A2 may be configured of the transmission body 653*a*, all of which transmit light of the same wavelength. Light having passed through the third transmission part 653 may travel between the second light-emitting parts 402 and then may reach the optical sensor 910 disposed to face the second area A2. In the case, only a specific wavelength light having passed through the third transmission part 653 may reach the optical sensor 910. A device of the optical sensor 910, which is configured to recognize light, may be configured as a device configured to more sensitively recognize light of a specific wavelength, and the third transmission part 653 may be configured to allow a wavelength which is sensitively recognized by the device included in the optical sensor 910 to pass therethrough, thereby improving light recognition efficiency of the optical sensor 910. In various embodiments, the optical sensor 910 configured to mainly use light of a specific wavelength may be used therein. For example, when the optical sensor 910 configured to mainly use a specific wavelength (e.g., red light) is used in order to identify a user's skin condition, the third transmission part 653 capable of transmitting light of a specific wavelength may be applied thereto.

An electronic device (e.g., the electronic device 100 of FIG. 1) according to various example embodiments may include: a display panel (e.g., the display panel 600 of FIG. 7B) including a light-emitting layer (e.g., the light-emitting layer 603 of FIG. 7B) in which multiple light-emitting parts (e.g., the light-emitting parts 401, 402, 403, and 404 of FIG. 7B) are arranged and a circuit layer (e.g., the circuit layer 602 of FIG. 7B) in which multiple circuit parts (e.g., the circuit parts 621 and 622 of FIG. 7B) electrically connected to at least some of the multiple light-emitting parts are arranged, and includes a first area (e.g., the first area A1 of FIG. 7B), a second area (e.g., the second area A2 of FIG. 7B) adjacent to the first area, and a third area (e.g., the third area A3 of FIG. 7B) other than the first area and the second area, and a camera (e.g., the camera device 500 of FIG. 5) disposed on or under a rear surface of a display including the display panel wherein a lens (e.g., the lens part 530 of FIG. 5) of the camera faces the first area of the display panel, wherein the first area of the display panel may be an area from which the circuit parts are removed, and an area in which a first light-emitting part (e.g., the first light-emitting part 401 of FIG. 7B) connected to a circuit part (e.g., the circuit part 621 of FIG. 7B) positioned in the second area is disposed, the second area of the display panel may be an area in which second light-emitting parts (e.g., the second light-emitting parts 402 of FIG. 7B) connected to the circuit part (e.g., the circuit part 621 of FIG. 7B) positioned in the second area and a dummy light-emitting part (e.g., the dummy light-emitting part 403 of FIG. 7B) not connected to the circuit part are arranged, and the third area of the display panel may be an area in which a fourth light-emitting part (e.g., the fourth light-emitting part 404 of FIG. 7B) connected to a circuit part (e.g., the circuit part 622 of FIG. 7B) disposed in the third area is disposed.

In addition, the dummy light-emitting part may be disposed between the second light-emitting parts, in the second area of the display panel.

In addition, a size of the dummy light-emitting part may be smaller than sizes of the second light-emitting parts.

In addition, sizes of the first light-emitting part and the second light-emitting parts may be larger than a size of the fourth light-emitting part.

In addition, a size of the dummy light-emitting part may be substantially identical to the size of the fourth light-emitting part.

An electronic device (e.g., the electronic device 100 of FIG. 1) according to various example embodiments may include: a display panel (e.g., the display panel 600 of FIG. 8B) including a transmission layer (e.g., the transmission layer 605 of FIG. 8B) including multiple transmission parts (e.g., the transmission parts 651, 652, 653, and 654 of FIG. 8B) configured to transmit light, a light-emitting layer (e.g., the light-emitting layer 603 of FIG. 8B) in which multiple light-emitting parts (e.g., the light-emitting parts 401, 402, 403, and 404 of FIG. 8B) are arranged, and a circuit layer (e.g., the circuit layer 602 of FIG. 8B) in which multiple circuit parts (e.g., the circuit parts 621 and 622 of FIG. 8B) electrically connected to at least some of the multiple light-emitting parts are arranged, and includes a first area (e.g., the first area A1 of FIG. 8B), a second area (e.g., the second area A2 of FIG. 8B) adjacent to the first area, and a third area (e.g., the third area A3 of FIG. 8B) other than the first area and the second area, and a camera (e.g., the camera device 500 of FIG. 5) disposed on or under a rear surface of the display panel such that a lens (e.g., the lens part 530 of FIG. 5) of the camera faces the first area of the display panel, wherein the first area of the display panel may be an area from which the circuit parts are removed, and an area including a first light-emitting part (e.g., the first light-emitting part 401 of FIG. 8B) connected to a circuit part (e.g., the circuit part 621 of FIG. 8B) positioned in the second area and a first transmission part (e.g., the first transmission part 651 of FIG. 8B) disposed at a position facing the first light-emitting part, the second area of the display panel may be an area including second light-emitting parts (e.g., the second light-emitting parts 402 of FIG. 8B) connected to the circuit part (e.g., the circuit part 621 of FIG. 8B) positioned in the second area, second transmission parts (e.g., the second transmission parts 652 of FIG. 8B) disposed at a position facing the second light-emitting part, and third transmission part (e.g., the third transmission part 653 of FIG. 8B) disposed between the second transmission parts and disposed at a position facing a space between the second light-emitting parts, and the third area of the display panel may be an area including a fourth light-emitting part (e.g., the fourth light-emitting part 404 of FIG. 8) connected to a circuit part (e.g., the circuit part 622 of FIG. 8B) disposed in the third area and a fourth transmission part (e.g., the fourth transmission part 654 of FIG. 8B) disposed at a position facing the fourth light-emitting part.

In addition, a size of the third transmission part may be smaller than sizes of the second transmission parts.

In addition, the second area of the display panel may further include a dummy light-emitting part (e.g., the dummy light-emitting part 403 of FIG. 8B) disposed between the second light-emitting parts disposed at a position facing the third transmission part and not connected to the circuit part positioned in the second area.

In addition, a size of the dummy light-emitting part may be smaller than sizes of the second light-emitting parts.

In addition, an optical sensor (e.g., the optical sensor 910 of FIG. 9A), disposed on the rear surface of a display including the display panel such that at least a part thereof faces the second area of the display panel, may be included therein.

In addition, the third transmission part may be configured to transmit light of a same wavelength.

A display according to various example embodiments may include: a display panel (e.g., the display panel 600 of FIG. 7B) including a light-emitting layer (e.g., the light-emitting layer 603 of FIG. 7B) in which multiple light-emitting parts (e.g., the light-emitting parts 401, 402, 403, and 404 of FIG. 7B) are arranged and a circuit layer (e.g., the circuit layer 602 of FIG. 7B) in which multiple circuit parts (e.g., the circuit parts 621 and 622 of FIG. 7B) electrically connected to at least some of the multiple light-emitting parts are arranged, and includes a first area (e.g., the first area A1 of FIG. 7B), a second area (e.g., the second area A2 of FIG. 7B) adjacent to the first area, and a third area (e.g., the third area A3 of FIG. 7B) other than the first area and the second area, wherein the first area of the display panel may be an area facing a lens (e.g., the lens part 530 of FIG. 5) of a camera (e.g., the camera device 500 of FIG. 5) disposed on or under a rear surface of the display and from which the circuit parts are removed, and an area in which a first light-emitting part (e.g., the first light-emitting part 401 of FIG. 7B) connected to a circuit part (e.g., the circuit part 621 of FIG. 7B) positioned in the second area is disposed, the second area of the display panel may be an area in which second light-emitting parts (e.g., the second light-emitting parts 402 of FIG. 7B) connected to the circuit part (e.g., the circuit part 621 of FIG. 7B) positioned in the second area and a dummy light-emitting part (e.g., the dummy light-emitting part 403 of FIG. 7B) not connected to the circuit part are arranged, and the third area of the display panel may be an area in which a fourth light-emitting part (e.g., the fourth light-emitting part 404 of FIG. 7B) connected to a circuit part (e.g., the circuit part 622 of FIG. 7B) disposed in the third area is disposed.

In addition, the dummy light-emitting part may be disposed between the second light-emitting parts, in the second area of the display panel.

In addition, a size of the dummy light-emitting part may be smaller than sizes of the second light-emitting parts.

In addition, sizes of the first light-emitting part and the second light-emitting parts may be larger than a size of the fourth light-emitting part.

A display according to various example embodiments may include: a display panel (e.g., the display panel 600 of FIG. 8B) including a transmission layer (e.g., the transmission layer 605 of FIG. 8B) including multiple transmission parts (e.g., the transmission parts 651, 652, 653, and 654 of FIG. 8B) configured to transmit light, a light-emitting layer (e.g., the light-emitting layer 603 of FIG. 8B) in which multiple light-emitting parts (e.g., the light-emitting parts 401, 402, 403, and 404 of FIG. 8B) are arranged, and a circuit layer (e.g., the circuit layer 602 of FIG. 8B) in which multiple circuit parts (e.g., the circuit parts 621 and 622 of FIG. 8B) electrically connected to at least some of the multiple light-emitting parts are arranged, and includes a first area (e.g., the first area A1 of FIG. 8B), a second area (e.g., the second area A2 of FIG. 8B) adjacent to the first area, and a third area (e.g., the third area A3 of FIG. 8B) other than the first area and the second area, wherein the first area of the display panel may be an area facing a lens (e.g., the lens part 530 of FIG. 5) of a camera (e.g., the camera device 500 of FIG. 5) disposed on or under a rear surface of the display and from which the circuit parts are removed, and an area including a first light-emitting part (e.g., the first light-emitting part 401 of FIG. 8B) connected to a circuit part positioned in the second area and a first transmission part (e.g., the first transmission part 651 of FIG. 8B) disposed at a position facing the first light-emitting part, the second area of the display panel may be an area including second light-emitting parts (e.g., the second light-emitting parts 402 of FIG. 8B) connected to the circuit part positioned in the second area, second transmission parts (e.g., the second transmission parts 652 of FIG. 8B) disposed at a position facing the second light-emitting part, and a third transmission part (e.g., the third transmission part 653 of FIG. 8B) disposed between the second transmission parts disposed at a position facing a space between the second light-emitting parts, and the third area of the display panel may be an area including a fourth light-emitting part (e.g., the fourth light-emitting part 404 of FIG. 8B) connected to a circuit part (e.g., the circuit part 622 of FIG. 8B) disposed in the third area and a fourth transmission part (e.g., the fourth transmission part 654 of FIG. 8B) disposed at a position facing the fourth light-emitting part.

In addition, a size of the third transmission part may be smaller than sizes of the second transmission parts.

In addition, the second area of the display panel may further include a dummy light-emitting part (e.g., the dummy light-emitting part 403 of FIG. 8B) disposed between the second light-emitting parts to be disposed at a position facing the third transmission part and not connected to the circuit part positioned in the second area.

In addition, a size of the dummy light-emitting part may be smaller than sizes of the second light-emitting parts.

In addition, the second area of the display panel may be an area facing an optical sensor (e.g., the optical sensor 910 of FIG. 9A) disposed on or under the rear surface of the display.

While the disclosure has been illustrated and described with reference to various example embodiments, it will be understood that the various example embodiments are intended to be illustrative, not limiting. It will be further understood by those skilled in the art that the scope of the disclosure includes not only embodiments disclosed herein but also all changed or modified forms derived based on the technical idea of various embodiments disclosed herein. It will also be understood that any of the embodiment(s) described herein may be used in conjunction with any other embodiment(s) described herein.

What is claimed is:

1. An electronic device comprising:
   a display panel comprising a light-emitting layer in which multiple light-emitting parts are arranged and a circuit layer in which multiple circuit parts electrically connected to at least some of the multiple light-emitting parts are arranged, the display panel including a first area, a second area adjacent to the first area, and a third area other than the first area and the second area; and
   a camera disposed on or under a rear surface of a display comprising the display panel wherein a lens of the camera faces the first area of the display panel, wherein:
   the first area of the display panel comprises an area in which the circuit parts are not present, and an area in which a first light-emitting part connected to a circuit part positioned in the second area is disposed;
   the second area of the display panel comprises an area in which second light-emitting parts connected to the circuit part positioned in the second area and a dummy light-emitting part not connected to the circuit part are arranged; and
   the third area of the display panel comprises an area in which a fourth light-emitting part connected to a circuit part disposed in the third area is disposed.
2. The electronic device of claim 1, wherein
   in the second area of the display panel,
   the dummy light-emitting part is disposed between the second light-emitting parts.
3. The electronic device of claim 1, wherein
   a size of the dummy light-emitting part is smaller than sizes of the second light-emitting parts.
4. The electronic device of claim 1, wherein
   sizes of the first light-emitting part and the second light-emitting parts are larger than a size of the fourth light-emitting part.
5. The electronic device of claim 1, wherein
   a size of the dummy light-emitting part is substantially identical to a size of the fourth light-emitting part.
6. The electronic device of claim 1, wherein
   the display panel comprises a transmission layer comprising multiple transmission parts configured to transmit light;
   the first area of the display panel comprises a first transmission part disposed at a position facing the first light-emitting part;
   the second area of the display panel comprises second transmission parts arranged at position facing the second light-emitting parts, and a third transmission part disposed between the second transmission parts disposed at a position facing a space between the second light-emitting parts; and
   the third area of the display panel comprises a fourth transmission part disposed at a position facing the fourth light-emitting part.
7. The electronic device of claim 6, wherein
   a size of the third transmission part is smaller than sizes of the second transmission parts.
8. The electronic device of claim 6, wherein
   the dummy light-emitting part is disposed between the second light-emitting parts disposed at a position facing the third transmission part and not connected to the circuit part positioned in the second area.
9. The electronic device of claim 8, wherein
   a size of the dummy light-emitting part is smaller than sizes of the second light-emitting parts.
10. The electronic device of claim 6, further comprising
    an optical sensor disposed on or under the rear surface of a display comprising the display panel such that at least a part of the optical sensor faces the second area of the display panel.
11. The electronic device of claim 9, wherein
    the third transmission part is configured to transmit light of a same wavelength.
12. A display comprising:
    a display panel comprising: a light-emitting layer in which multiple light-emitting parts are arranged, and a circuit layer in which multiple circuit parts electrically connected to at least some of the multiple light-emitting parts are arranged, the display panel including a first area, a second area adjacent to the first area, and a third area other than the first area and the second area, wherein
    the first area of the display panel comprises an area facing a lens of a camera disposed on or under the rear surface of the display and in which the circuit parts are not present, and an area in which a first light-emitting part connected to a circuit part positioned in the second area is disposed;
    the second area of the display panel comprises an area in which second light-emitting parts connected to the circuit part positioned in the second area and a dummy light-emitting part not connected to the circuit part are arranged; and
    the third area of the display panel comprises an area in which a fourth light-emitting part connected to a circuit part disposed in the third area is disposed.
13. The display of claim 12, wherein
    in the second area of the display panel,
    the dummy light-emitting part is disposed between the second light-emitting parts.
14. The display of claim 12, wherein
    a size of the dummy light-emitting part is smaller than a size of the second light-emitting parts.
15. The display of claim 12, wherein
    sizes of the first light-emitting part and the second light-emitting parts are larger than a size of the fourth light-emitting part.
16. A display comprising:
    a display panel comprising a transmission layer comprising multiple transmission parts configured to transmit light, a light-emitting layer in which multiple light-emitting parts are arranged, and a circuit layer in which multiple circuit parts electrically connected to at least some of the multiple light-emitting parts are arranged, the display panel including a first area, a second area adjacent to the first area, and a third area other than the first area and the second area, wherein:

the first area of the display panel is an area facing a lens of a camera disposed on the rear surface of the display and in which the circuit parts are not present, and an area comprising a first light-emitting part connected to a circuit part positioned in the second area and a first transmission part disposed at a position facing the first light-emitting part;

the second area of the display panel comprises an area comprising second light-emitting parts connected to the circuit part positioned in the second area, second transmission parts disposed at a position facing the second light-emitting parts, and a third transmission part disposed between the second transmission parts disposed at a position facing a space between the second light-emitting parts; and the third area of the display panel comprises an area comprising a fourth light-emitting part connected to a circuit part disposed in the third area and a fourth transmission part disposed at a position facing the fourth light-emitting part.

17. The display of claim 16, wherein
a size of the third transmission part is smaller than sizes of the second transmission parts.

18. The display of claim 16, wherein
the second area of the display panel further comprises a dummy light-emitting part disposed between the second light-emitting parts disposed at a position facing the third transmission part and not connected to the circuit part positioned in the second area.

19. The display of claim 18, wherein
a size of the dummy light-emitting part is smaller than a size of the second light-emitting parts.

20. The display of claim 16, wherein
the second area of the display panel is an area facing an optical sensor disposed on the rear surface of the display.

* * * * *